(12) United States Patent
Maebashi et al.

(10) Patent No.: US 8,022,525 B2
(45) Date of Patent: Sep. 20, 2011

(54) SEMICONDUCTOR DEVICE AND METHOD OF MANUFACTURING SEMICONDUCTOR DEVICE

(75) Inventors: Takanori Maebashi, Kisarazu (JP); Nobuaki Miyakawa, Niiza (JP)

(73) Assignee: Honda Motor Co., Ltd., Tokyo (JP)

( * ) Notice: Subject to any disclaimer, the term of this patent is extended or adjusted under 35 U.S.C. 154(b) by 260 days.

(21) Appl. No.: 12/369,456

(22) Filed: Feb. 11, 2009

(65) Prior Publication Data

US 2009/0206469 A1   Aug. 20, 2009

(30) Foreign Application Priority Data

Feb. 15, 2008   (JP) ................. 2008-035163

(51) Int. Cl.
*H01L 23/02* (2006.01)
*H01L 21/44* (2006.01)

(52) U.S. Cl. . 257/686; 257/777; 257/723; 257/E23.145; 438/109

(58) Field of Classification Search .................. 257/686, 257/777, 723, E23.145
See application file for complete search history.

(56) References Cited

U.S. PATENT DOCUMENTS

| | | | | |
|---|---|---|---|---|
| 5,583,321 A * | 12/1996 | DiStefano et al. | ............ | 174/264 |
| 6,239,495 B1 * | 5/2001 | Sakui et al. | .................. | 257/777 |
| 6,495,914 B1 * | 12/2002 | Sekine et al. | ................. | 257/723 |
| 6,734,568 B2 * | 5/2004 | Matsuo et al. | ................. | 257/781 |
| 7,138,710 B2 * | 11/2006 | Fukazawa | ..................... | 257/686 |
| 7,180,149 B2 * | 2/2007 | Yamamoto et al. | ........... | 257/434 |
| 7,781,867 B2 * | 8/2010 | Lee | ................ | 257/618 |
| 2005/0017338 A1 * | 1/2005 | Fukazawa | ..................... | 257/686 |
| 2006/0131713 A1 * | 6/2006 | Fukazawa | ..................... | 257/685 |
| 2008/0079159 A1 * | 4/2008 | Gupta et al. | ................. | 257/758 |

FOREIGN PATENT DOCUMENTS

JP   2007-059769 A   3/2007

* cited by examiner

*Primary Examiner* — Nitin Parekh
(74) *Attorney, Agent, or Firm* — Birch, Stewart, Kolasch & Birch, LLP

(57) ABSTRACT

A semiconductor device has a plurality of wafers which are laminated to each other, wherein: each wafer includes an lamination surface to which another wafer is laminated and a substrate having an element formed thereon; the lamination surface is provided with an electric signal connecting portion that electrically connects to said another wafer so as to form a semiconductor circuit; at least one of the electrical signal connecting portions facing each other is a protruding connection portion that protrudes from a region which exposes the substrate on the lamination surface; and a reinforcing protruding portion that is insulated from the semiconductor circuit, and is formed of the same material as the substrate to protrude from the lamination surface with a height equal to the length of a gap between the lamination surfaces of wafers facing each other is provided in an area where the protruding connection portion is not disposed on the lamination surface formed with the protruding connection portion.

11 Claims, 14 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing a semiconductor device. In particular, the invention relates to a semiconductor device in which a plurality of wafers are laminated together and a method of manufacturing a semiconductor device.

Priority is claimed on Japanese Patent Application No. 2008-035163, filed on Feb. 15, 2008, the content of which is incorporated herein by reference.

2. Description of Related Art

A three-dimensional semiconductor integrated circuit device having a configuration in which two or more wafers are laminated and are electrically connected to each other through an embedded wiring line is known in the related art. For example, Japanese Unexamined Patent Application, First Publication No. 2007-59769 (hereinafter Patent Document 1) discloses a semiconductor device that forms a desired semiconductor circuit by laminating a plurality of substrates together and electrically connecting semiconductor circuit portions formed on the substrates. In the semiconductor device disclosed in the Patent Document 1, a semiconductor circuit portion of an upper substrate and a semiconductor circuit portion of a lower substrate are electrically connected to each other by being laminated in a state where a penetrating wiring portion exposed from a bottom surface of the upper substrate and a bump of a principal surface of the lower substrate are in contact with each other.

However, in the known semiconductor device in which a plurality of wafers are laminated together, the plurality of wafers are electrically connected to each other through an electric signal connecting portion, such as a bump or a penetrating wiring portion protruding from a lamination surface. Specifically, in the technique disclosed in the Patent Document 1, the upper substrate and the lower substrate are electrically connected to each other through the penetrating wiring portion protruding from the bottom surface of the upper substrate and the bump protruding from the principal surface of the lower substrate.

When electrically connecting the plurality of wafers through the electric signal connecting portion protruding from the lamination surface as described above, the electric signal connecting portion was often damaged in laminating the wafers together. If the electric signal connecting portion is damaged, the electrical stability or reliability in the electric signal connecting portion becomes insufficient or the mechanical characteristics of the semiconductor device become unstable. Accordingly, there was a possibility that a semiconductor device with stable performance could not be obtained.

In view of the above situation, it is an object of the invention to provide a semiconductor device which is able to effectively prevent damage occurring in an electric signal connecting portion protruding from a lamination surface in laminating a plurality of wafers together and which has excellent reliability and stable performance.

In addition, it is another object of the invention to provide a method of manufacturing a semiconductor device which is able to effectively prevent damage occurring in an electric signal connecting portion protruding from a lamination surface in laminating a plurality of wafers together and which has excellent reliability and stable performance.

SUMMARY OF THE INVENTION

In order to achieve the above objects, the inventors examined the cause of damage of an electric signal connecting portion (hereinafter, also referred to as a "protruding connection portion") protruding from a lamination surface. As a result, it was found that the damage to the protruding connection portion occurred because an excessive load was applied to some protruding connection portions by a variation in load applied in laminating a plurality of wafers together. Then, the inventors completed a semiconductor device and a method of manufacturing a semiconductor device capable of reducing the variation in load applied to the protruding connection portion and of effectively reinforcing the protruding connection portion.

According to the present invention, a semiconductor device has a plurality of wafers which are laminated to each other, wherein: each wafer includes an lamination surface to which another wafer is laminated and a substrate having an element formed thereon; the lamination surface is provided with an electric signal connecting portion that electrically connects to said another wafer so as to form a semiconductor circuit; at least one of the electrical signal connecting portions facing each other is a protruding connection portion that protrudes from a region which exposes the substrate on the lamination surface; and a reinforcing protruding portion that is insulated from the semiconductor circuit, and is formed of the same material as the substrate to protrude from the lamination surface with a height equal to the length of a gap between the lamination surfaces of wafers facing each other is provided in an area where the protruding connection portion is not disposed on the lamination surface formed with the protruding connection portion.

Moreover, the inventors examined the type of a particular arrangement of protruding connection portions, which are easily damaged, noting the relationship between the arrangement of protruding connection portions on a lamination surface and damage to the protruding connection. As a result, it was found that damage easily occurred particularly in the arrangements of protruding connection portions shown in the following (1) to (3). FIGS. 1A to 1D are plan views illustrating examples of the arrangement of protruding connection portions in a lamination surface and in particular, views illustrating the arrangements of protruding connection portions which are easily damaged.

(1) As shown in FIG. 1A, one isolated protruding connection portion 51a without another protruding connection portion 51a disposed therearound or in the vicinity thereof even though there is a space where another protruding connection portion 51a can be disposed around or in the vicinity of the isolated protruding connection portion 51a.

(2) As shown in FIGS. 1B and 1C, in the case where a protruding connection portion group 51d in which a plurality of protruding connection portions 51b are disposed adjacent to each other is formed, protruding connection portions disposed at an outermost periphery portion of a protruding connection portion group 51d when another protruding connection portion 51b is not disposed around or in the vicinity of the protruding connection portion group 51d even though there is a space where another protruding connection portion 51b can be disposed around or in the vicinity of the protruding connection portion group 51d. In particular, four protruding connection portions 51c disposed at the corners of the protruding connection portion group 51d when the protruding connection portion group 51d has a rectangular shape as shown in FIGS. 1B and 1C.

(3) As shown in FIG. 1D, in the case where two or more protruding connection portion groups 51d, in which the plurality of protruding connection portions 51b are disposed adjacent to each other, are formed to thereby form a protruding connection portion collection 51f including two or more (two in the example shown in FIG. 1D) protruding connection portion groups 51d adjacent to each other, protruding connection portions disposed at an outermost periphery portion of the protruding connection portion collection 51f when another protruding connection portion 51b is not disposed around or in the vicinity of the protruding connection portion collection 51f even though there is a space where another protruding connection portion 51b can be disposed around or in the vicinity of the protruding connection portion collection 51f. In particular, four protruding connection portions 51g disposed at the corners of the protruding connection portion collection 51f when the protruding connection portion collection 51f has a rectangular shape. Moreover, in the protruding connection portion collection 51f, a protruding connection portion 51e, which is disposed at another adjacent protruding connection portion group 51d, among the protruding connection portions disposed at the corners of the protruding connection portion group 51d has another protruding connection portion disposed in the vicinity. Accordingly, it is difficult for damage to occur.

Furthermore, the inventors made a semiconductor device capable of effectively reinforcing the protruding connection portions in the particular arrangements shown in (1) to (3), which are easily damaged, by using the arrangements of reinforcing protruding portions shown in the following (I) to (III). FIGS. 2A to 2D are plan views schematically illustrating only a reinforcing protruding portion and a protruding connection portion in a state where a part of the semiconductor device of the invention is enlarged, which are plan views illustrating examples of the arrangement of the reinforcing protruding portion and the protruding connection portion in a lamination surface. In addition, the arrangements of protruding connection portions shown in FIGS. 2A to 2D are the same as those shown in FIGS. 1A to 1D.

In the semiconductor device of the present invention, (I) a plurality of the reinforcing protruding portions may be disposed so as to surround the one protruding connection portion, as shown in FIG. 2A.

Furthermore, in the semiconductor device of the invention, (II) the plurality of protruding connection portions may be disposed adjacent to each other to thereby form a protruding connection portion group, and a plurality of the reinforcing protruding portions may be disposed so as to surround the protruding connection portion group, as shown in FIGS. 2B and 2C.

In the semiconductor device of the invention, (III) the plurality of protruding connection portions may be disposed adjacent to each other to thereby form two or more protruding connection portion groups, and a plurality of the reinforcing protruding portions may be disposed so as to surround the two or more protruding connection portion groups formed adjacent to each other, as shown in FIG. 2D.

At least one of the electric signal connecting portions may be an end of a penetrating wiring portion which makes one and the other surfaces of the wafer electrically conductive.

According to the present invention, a method of manufacturing a semiconductor device includes: forming the protruding connection portion which protrudes from a region which exposes the substrate on the lamination surface of at least one of the plurality of wafers; forming a reinforcing protruding portion that is insulated from the semiconductor circuit and is formed of the same material as the substrate to protrude from the lamination surface with a height equal to the length of a gap between the lamination surfaces of wafers facing each other in an area where the protruding connection portion is not disposed on the lamination surface formed with the protruding connection portion; and forming the semiconductor circuit by laminating the plurality of wafers together and electrically connecting the electric signal connecting portions of each wafer.

The forming of the protruding connection portion and the forming of the reinforcing protruding portion may include: forming a conductive portion, which becomes the protruding connection portion, by forming a groove in one surface of the substrate and embedding a conductive layer in the groove; and forming the protruding connection portion which protrudes from the lamination surface by exposing a part of the conductive portion by etching the substrate from the bottom surface selectively and simultaneously forming the reinforcing protruding portion which is a part of the substrate and has a column-like shape.

According to the semiconductor device of the present invention, at least one of the electric signal connecting portions facing each other is a protruding connection portion formed to protrude from the lamination surface which exposes the substrate and the reinforcing protruding portion which is formed of the same material as the substrate, is insulated from the semiconductor circuit, protrudes from the lamination surface with a height equal to the length of a gap between the wafers laminated to each other, and is formed in an area where the electric signal connecting portion is not disposed on the lamination surface formed with the protruding connection portion. Accordingly, since the load applied to the protruding connection portion is also applied to the reinforcing protruding portion when laminating the plurality of wafers together, a variation in load applied to the protruding connection portion is reduced. As a result, damage to the protruding connection portion occurring when laminating a plurality of wafers together can be effectively prevented. As a result, the semiconductor device of the invention has excellent reliability and stable performance. In addition, since the reinforcing protruding portion is insulated from the semiconductor circuit, the reinforcing protruding portion does not have an effect on the semiconductor circuit which forms the semiconductor device.

In addition, since the reinforcing protruding portion is formed on the lamination surface which exposes the substrate and is formed of the same material as the substrate, the reinforcing protruding portion is easily formed by etching the substrate from the lamination surface selectively.

In addition, the method of manufacturing a semiconductor device of the invention includes: forming a protruding connection portion protruding from a lamination surface on the lamination surface, which exposes the substrate, of at least one of a plurality of wafers; forming a reinforcing protruding portion which is formed of the same material as the substrate, is insulated from the semiconductor circuit, and protrudes from the lamination surface with a height equal to the length of the gap between the lamination surfaces the wafers laminated to each other, in an area where the electric signal connecting portion is not disposed on the lamination surface formed with the protruding connection portion; and forming a desired semiconductor circuit by laminating the plurality of wafers together and electrically connecting the electric signal connecting portions of the wafers with each other. Accordingly, even if the load is applied to the protruding connection portion when laminating the plurality of wafers together, the variation in load applied to the protruding connection portion is reduced since the load applied to the protruding connection portion is also applied to the reinforcing protruding portion. Therefore, according to the method of manufacturing a semiconductor device of the invention, a semiconductor device which is able to effectively prevent damage occurring in the protruding connection portion in laminating a plurality of wafers together and which has excellent reliability and stable performance can be obtained.

DETAILED DESCRIPTION OF THE INVENTION

Hereinafter, the invention will be described in detail with reference to the accompanying drawings.

Figure 18:
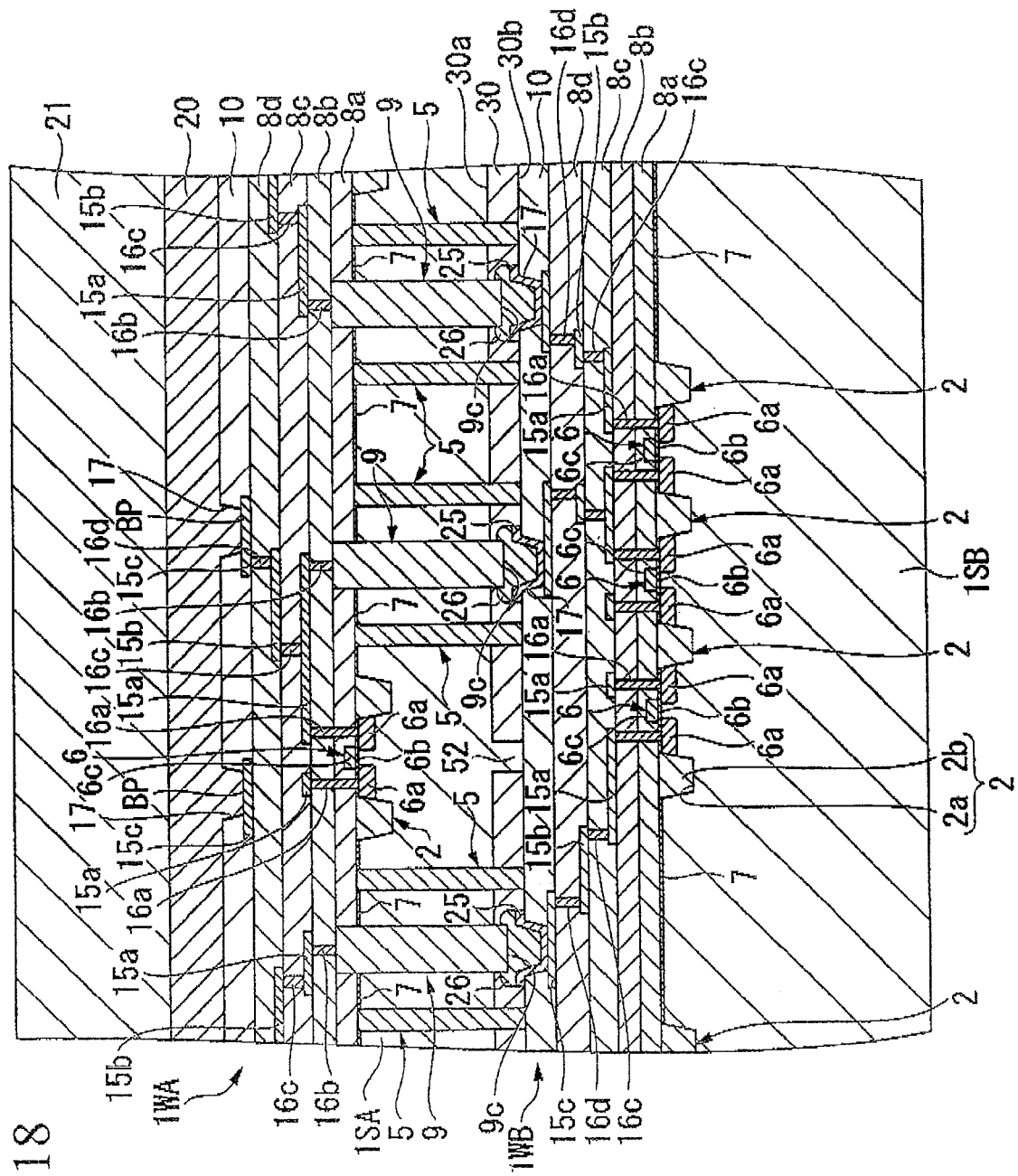
FIG. 18 is a cross-sectional view illustrating the main parts in the process of laminating upper and lower wafers together subsequent to FIG. 17.
Figure 19:
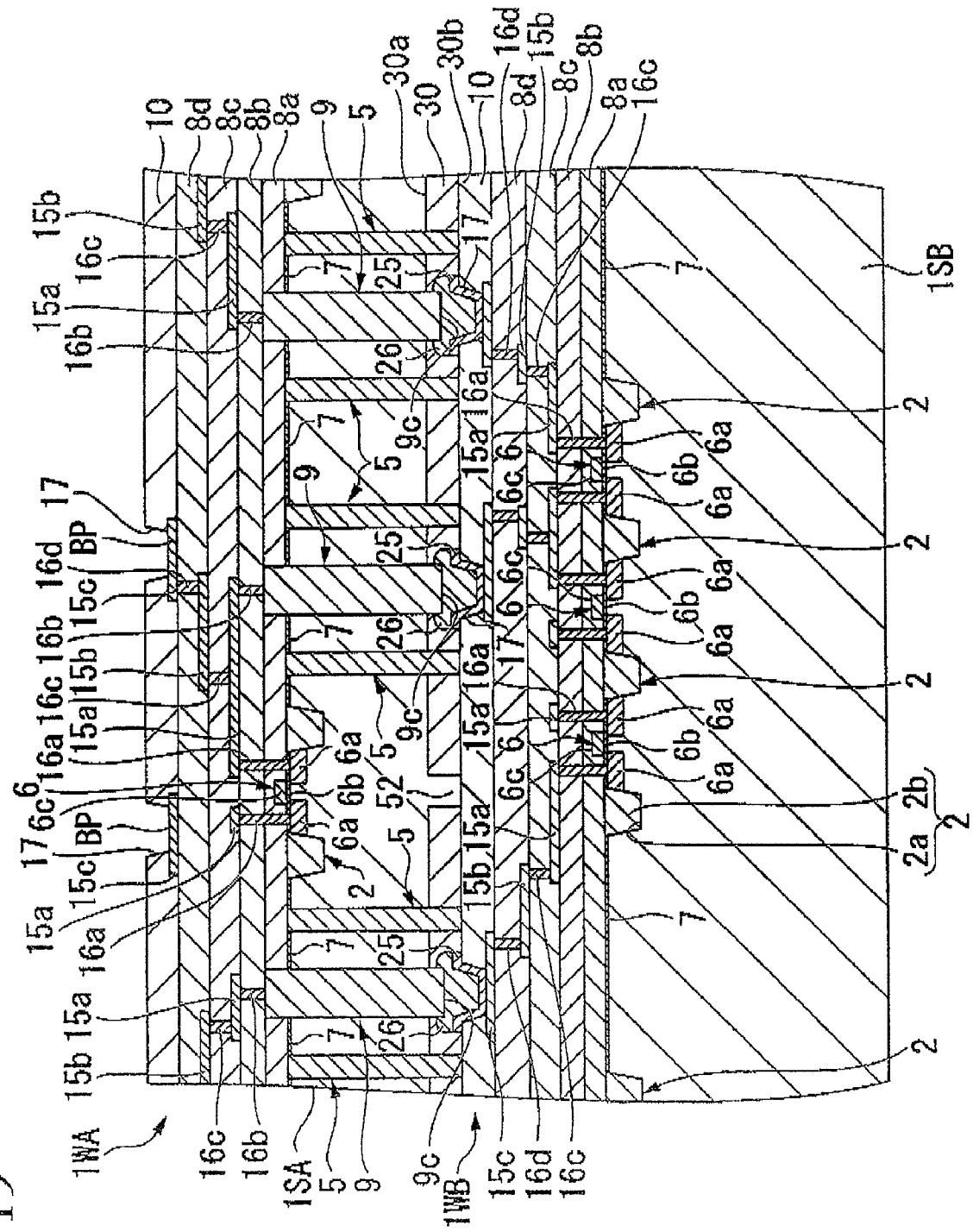
FIG. 19 is a cross-sectional view illustrating the main parts in an example of a semiconductor device of the invention.
Figure 20:
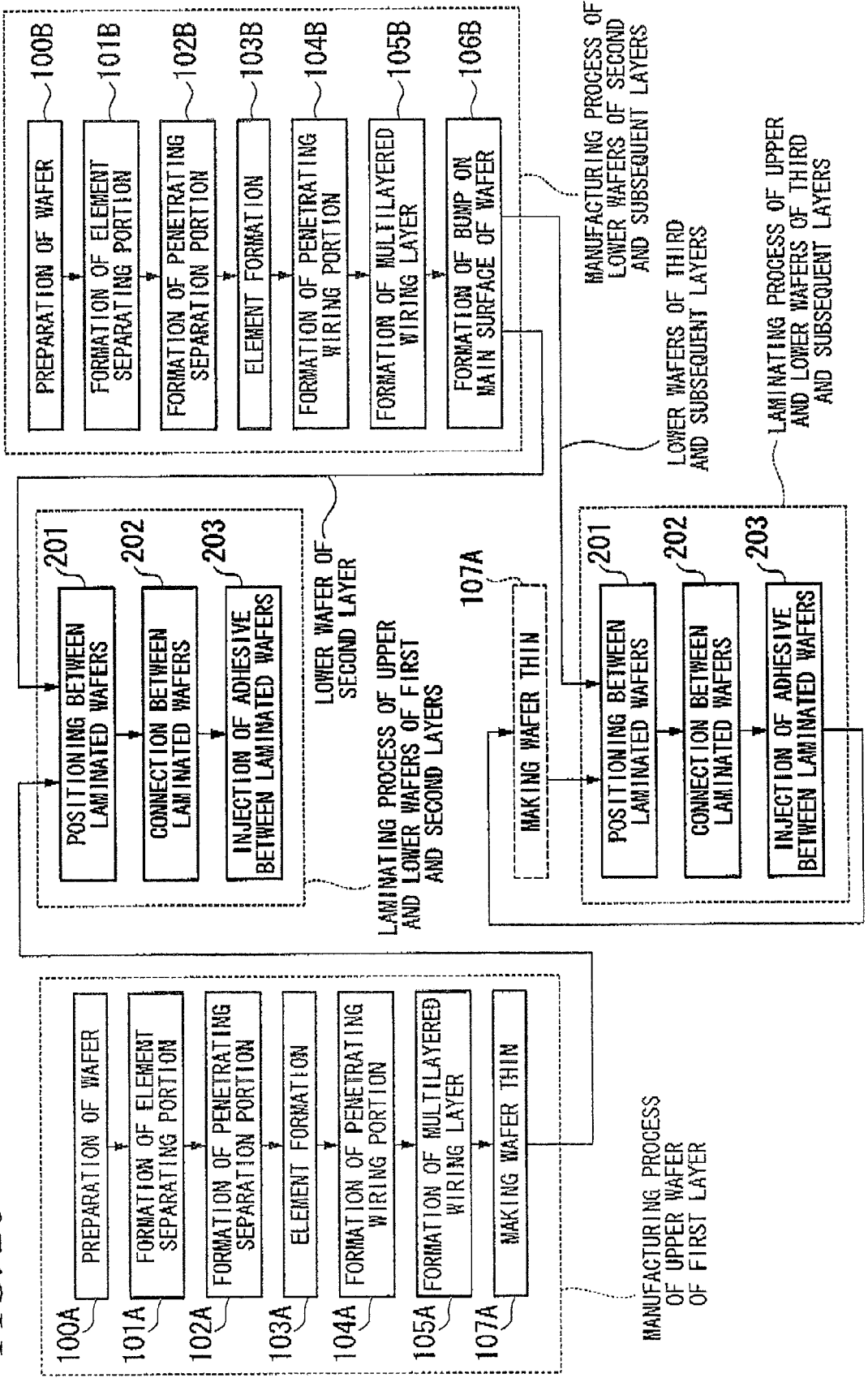
FIG. 20 is a flow chart illustrating a manufacturing process of the semiconductor device shown in FIG. 19.

FIGS. 3 to 20 are views illustrating a semiconductor device and a method of manufacturing a semiconductor device of the invention. FIG. 19 is a cross-sectional view illustrating the main parts in an example of the semiconductor device of the invention. FIGS. 3 to 18 are views illustrating a manufacturing process of the semiconductor device shown in FIG. 19. FIG. 20 is a flow chart illustrating the manufacturing process of the semiconductor device shown in FIG. 19.

The semiconductor device according to the present embodiment shown in FIG. 19 has an upper wafer 1WA and a lower wafer 1WB laminated to each other. An electric signal connecting portion formed by a penetrating wiring portion 9 is provided on a lamination surface 30a of the upper wafer 1WA facing the lower wafer 1WB. The penetrating wiring portion 9 is formed to pass through a substrate 1SA that forms the upper wafer 1WA and serves to make a main surface (one surface, upper surface in FIG. 19) and a bottom surface (the other surface, lower surface in FIG. 19), which are opposite to each other in the thickness direction of the upper wafer 1WA, electrically conductive. In addition, an electric signal connecting portion formed by a bump 26 is provided on a lamination surface 30b of the lower wafer 1WB facing the upper wafer 1WA. In addition, in the semiconductor device shown in FIG. 19, a desired semiconductor circuit having MOSFETs 6 provided in the substrates 1SA and 1SB that form the wafers 1WA and 1WB, respectively, is formed by electrically connecting an end 9c of the penetrating wiring portion 9 of the upper wafer 1WA with the bump 26 of the lower wafer 1WB, the upper wafer 1WA and the lower wafer 1WB being disposed to face each other.

In addition, as shown in FIG. 19, an insulating adhesive 30 is injected between the lamination surfaces 30a and 30b of the upper and lower wafers 1WA and 1WB. By the adhesive 30, the mechanical strength between the upper and lower wafers 1WA and 1WB is secured. In addition, although the case where the adhesive 30 is injected into the inside of a frame of a penetrating separation portion 5 is illustrated in the present embodiment, the adhesive 30 does not have an effect on the characteristics of the semiconductor circuit because the insulating adhesive 30 is used as an adhesive.

In addition, in the semiconductor device shown in FIG. 19, the penetrating wiring portion 9 of the upper wafer 1WA which is an electric signal connecting portion is a protruding connection portion having the end 9c formed to protrude from the lamination surface 30a which exposes the substrate 1SA.

In addition, in an area where the penetrating wiring portion 9 is not disposed on the lamination surface 30a of the upper wafer 1WA formed with the penetrating wiring portion 9, a reinforcing protruding portion 52 that is formed of the same material as the substrate, is insulated from the semiconductor circuit, and protrudes from the lamination surface 30a to have the same height equal to the length of the gap between the wafers 1WA and 1WB laminated to each other is formed. In the semiconductor device shown in FIG. 19, the reinforcing protruding portion 52 is a part of the substrate 1SA. In addition, the reinforcing protruding portion 52 is insulated by interlayer insulating layers (insulating layer) 8a, 8b, 8c, and 8d, the penetrating separation portion 5, the adhesive 30, and the like so that the reinforcing protruding portion 52 is not electrically connected to the wiring lines 15a, 15b, and 15c, the MOSFET 6, the penetrating wiring portion 9, and the bump 26 that form the semiconductor circuit.

In the present embodiment, although the planar arrangement of the reinforcing protruding portion 52 and the penetrating wiring portion 9 which is a protruding connection portion is not particularly limited, the same arrangement as a reinforcing protruding portion 52 and a protruding connection portion 51a shown in FIGS. 2A to 2D, for example, is preferable to effectively prevent the penetrating wiring portion 9 and the bump 26 from being damaged.

Figure 1A:
FIGS. 1A to 1D are plan views illustrating examples of the arrangement of protruding connection portions in a lamination surface and in particular, views illustrating the arrangements of protruding connection portions which are easily damaged.
Figure 1B:
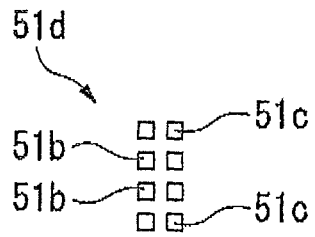
Figure 1C:
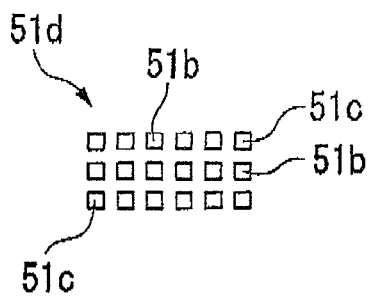
Figure 1D:
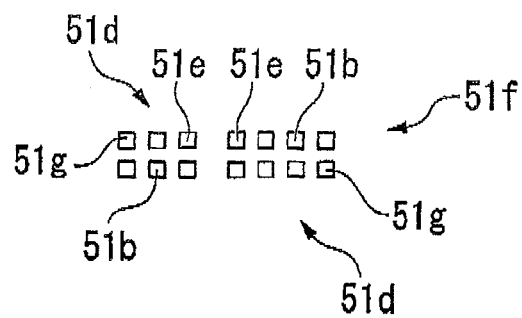
Figure 2A:
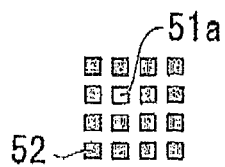
FIGS. 2A to 2D are plan views schematically illustrating only a reinforcing protruding portion and a protruding connection portion in a state where a part of the semiconductor device of the invention is enlarged, which are plan views illustrating examples of the arrangement of the reinforcing protruding portion and the protruding connection portion in a lamination surface.

For example, when the protruding connection portion 51a is one isolated protruding connection portion 51a without another protruding connection portion 51a disposed therearound or in the vicinity thereof even though there is a space where another protruding connection portion 51a can be disposed as shown in FIG. 2A, it is preferable to dispose the reinforcing protruding portion 52 to surround the one protruding connection portion 51a.

Figure 2B:
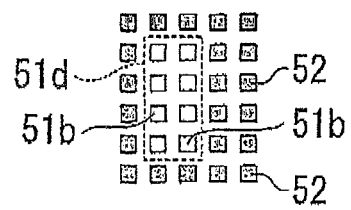
Figure 2C:
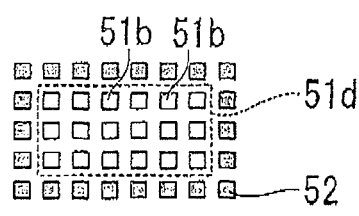

In addition, as shown in FIGS. 2B and 2C, when a protruding connection portion group 51d, in which a plurality of protruding connection portions 51b are disposed adjacent to each other, is formed and another protruding connection portion 51b is not disposed around or in the vicinity of the protruding connection portion group 51d even though there is a space around or in the vicinity of the protruding connection portion group 51d where another protruding connection portion 51b can be disposed, it is preferable to dispose the plurality of reinforcing protruding portions 52 to surround the protruding connection portion group 51d.

Figure 2D:
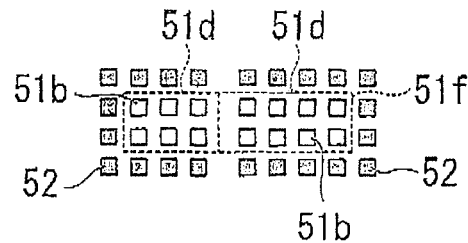

In addition, as shown in FIG. 2D, when two or more protruding connection portion groups 51d, in which the plurality of protruding connection portions 51b are disposed adjacent to each other, are formed and a protruding connection portion collection 51f including two or more protruding connection portion groups 51d adjacent to each other is formed even though there is a space around or in the vicinity of the protruding connection portion collection 51f where another protruding connection portion 51b can be disposed, it is preferable to dispose the plurality of reinforcing protruding portions 52 to surround the protruding connection portion collection 51f.

In addition, the reinforcing protruding portions 52 shown in FIGS. 2A to 2D may be disposed two or three times to surround the protruding connection portion 51a, the protruding connection portion group 51d, or the protruding connection portion collection 51f, or may be disposed singly as shown in FIGS. 2C and 2D. Alternatively, only some of the reinforcing protruding portions 52 may be disposed two or three times as shown in FIGS. 2A and 2B, or may be determined according to the arrangement of protruding connection portions, the size of the space where the reinforcing protruding portions 52 can be disposed, and the like. In addition, when only some of the reinforcing protruding portions 52 are disposed two or three times as shown in FIGS. 2A and 2B, the reinforcing protruding portions 52 are preferably disposed such that the arrangement of the reinforcing protruding portions 52 disposed at the outermost periphery portion has a shape close to a square in order to effectively reduce the variation in load applied to the protruding connection portion.

In addition, in the semiconductor device shown in FIG. 19, the upper wafer 1WA is a thin plate having an approximately circular shape in plan view, for example. The substrate 1SA that forms the upper wafer 1WA is formed of, for example, n-type or p-type silicon (Si) single crystal. As shown in FIG. 19, grooved separating portion 2 for element separation is formed on the main surface (that is, the main surface of the wafer 1WA) of the substrate 1SA. The grooved separating portion 2 is formed by embedding an insulating layer 2b, such as a silicon oxide (SiO$_2$). An active region of the main surface of the substrate 1SA is set by the separating portion 2.

Figure 9:
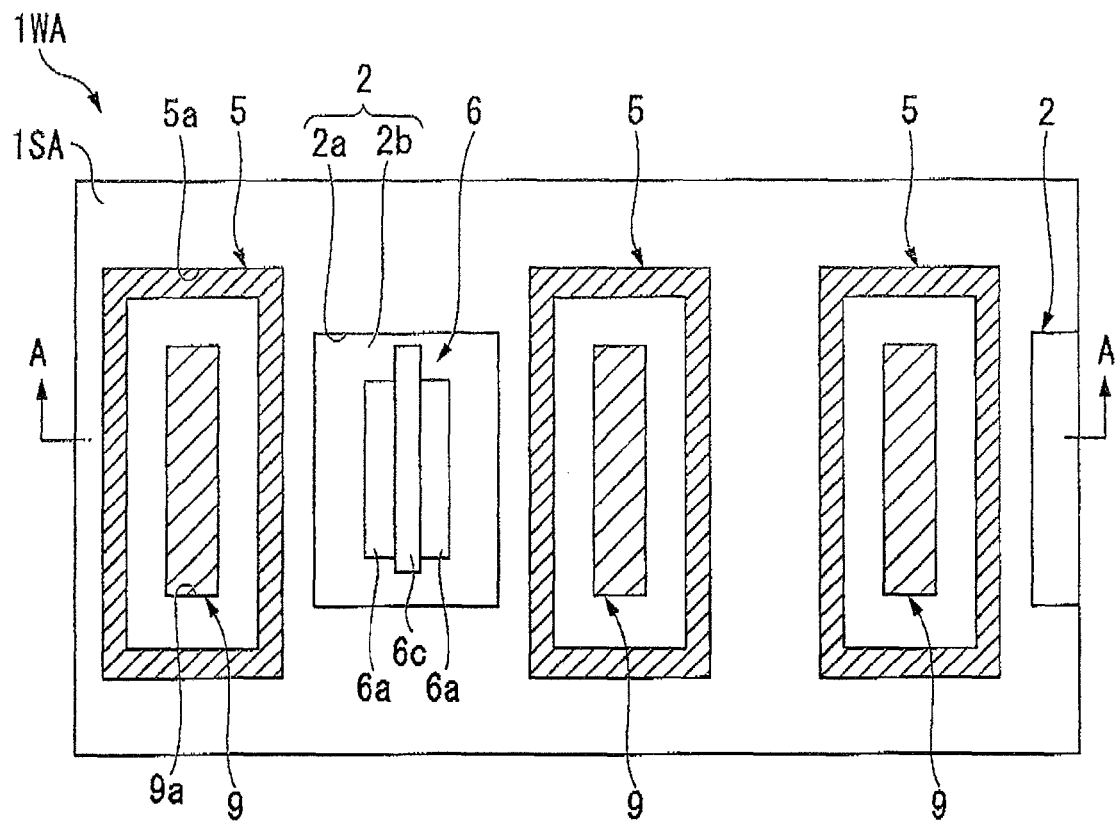
FIG. 9 is a plan view illustrating the main parts in a manufacturing process of the upper wafer subsequent to FIG. 8.

In addition, reference numeral 5 in the semiconductor device shown in FIG. 19 denotes a penetrating separation portion formed of an insulating layer passing through the substrate 1SA. As shown in FIG. 19, the height of the penetrating separation portion 5 protruding from the lamination surface 30a is the same as the size of a gap. In addition, as shown in FIG. 9, the penetrating separation portion 5 has a frame shape in plan view, and has a shape surrounding each penetrating wiring portion 9 individually.

The penetrating wiring portion 9 is formed so as to penetrate the substrate 1SA as shown in FIG. 19. The penetrating wiring portion 9 includes a main conductive film which is formed of tungsten and a barrier conductive film which is formed of titanium nitride with a thickness thinner than the thickness of the main conductive film and covers the side and bottom surfaces of the main conductive film. The penetrating wiring portion 9 is electrically connected with a laminating pad BP and MOSFET 6 through wiring lines 15a, 15b, and 15c.

Furthermore, an element used to form a semiconductor device, such as the MOSFET (metal oxide semiconductor field effect transistor) 6, is formed in the active region surrounded by the grooved separating portion 2. The MOSFET 6 has a semiconductor region 6a for source and drain, a gate insulating layer 6b, and a gate electrode 6c. The semiconductor region 6a for source and drain is formed by adding desired impurities (for example, phosphorus (P) or arsenic (As) in the case of an n-channel MOSFET 6, and boron (B) in the case of a p-channel MOSFET 6) in the substrate 1SA. The gate insulating layer 6b is formed of a silicon oxide, for example, and is formed on the main surface of the substrate 1SA. The gate electrode 6c is formed of, for example, polysilicon with low resistance and is formed on the gate insulating layer 6b. In addition, an insulating layer 7 on the main surface of the active region of the substrate 1SA is an insulating layer formed of a silicon oxide, for example.

In addition, instead of the MOSFET 6 shown in FIG. 19, other active elements, such as a bipolar transistor and a diode, may also be formed. Alternatively, passive elements, such as a resistor (a diffused resistor or a polysilicon resistor), a capacitor, and an inductor, may also be formed instead of the MOSFET 6.

Moreover, in FIG. 19, reference numerals 8a, 8b, 8c, and 8d denote interlayer insulating layers, reference numeral 10 denotes a passivation layer, reference numerals 15a, 15b, and 15c denote wiring lines, and reference numerals 16a, 16b, 16c, and 16d denote plugs. The interlayer insulating layers 8a, 8b, 8c, and 8d are formed of a silicon oxide, for example. The wiring lines 15a to 15c and the plugs 16a to 16d are formed of metal, such as tungsten (W), aluminum (Al), or copper (Cu). The wiring line 15a of a first layer is electrically connected to the gate electrode 6c and the semiconductor region 6a for source and drain of the MOSFET 6 through the plug 16a, and is also electrically connected to the penetrating wiring portion 9 through the plug 16b. The passivation layer 10 is formed, for example, by a single layer of a silicon oxide or by a laminated layer including a silicon oxide layer and a silicon nitride layer deposited on the silicon oxide layer. An opening 17 from which a part of the wiring line 15c of a third layer is exposed is formed in apart of the passivation layer 10. In addition, a part of the wiring line 15c exposed from the opening 17 in plan view is the laminating pad (hereinafter, referred to as a pad) BP. In addition, although not shown in FIG. 19, a bump may be formed to be connected to the pad BP on the main surface of the wafer 1WA.

Furthermore, in the semiconductor device shown in FIG. 19, the configuration of the lower wafer 1WB is almost the same as that of the upper wafer 1WA, but the penetrating separation portion 5, the penetrating wiring portion 9, and the reinforcing protruding portion 52 are not formed in the lower wafer 1WB. In addition, unlike the upper wafer 1WA, a bump base conductor pattern 25 electrically connected to the pad BP through the opening 17 is formed on the opening 17 formed on the main surface of the lower wafer 1WB. In addition, a bump 26 is formed on the bump base conductor pattern 25. The bump 26 is formed to protrude from the lamination surface 30b of the lower wafer 1WB. The bump 26 is formed of a conductive material such as copper, and is electrically connected to the wiring line 15c which is uppermost layer of the lower wafer 1WB.

Next, a manufacturing process of the semiconductor device shown in FIG. 19 will be described with reference to FIG. 20.

Figure 3:
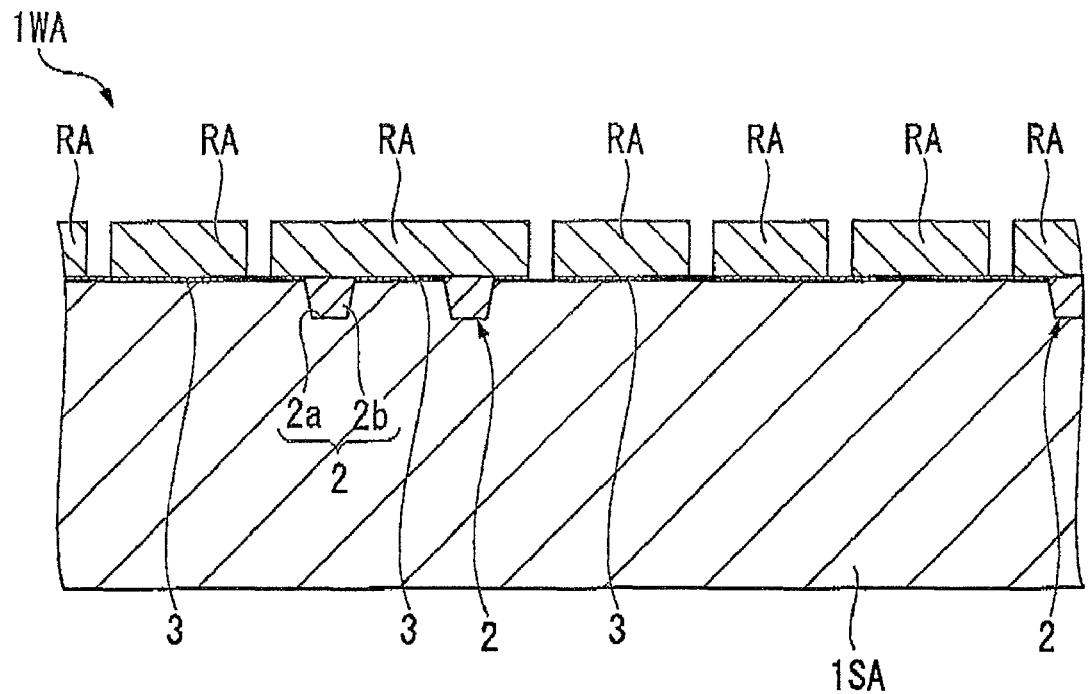
FIG. 3 is a cross-sectional view illustrating the main parts in a manufacturing process of an upper wafer.

A manufacturing process (manufacturing process of an upper wafer of a first layer in FIG. 20) of an upper wafer will be described first. The upper wafer 1WA is prepared (process 100A in FIG. 20). Then, as shown in FIG. 3, the grooved separating portion 2 for element separation is formed on the main surface (that is, the main surface of the wafer 1WA) of the substrate 1SA (process 101A in FIG. 20). The separating portion 2 is formed by forming a separation groove 2a on the main surface of the substrate 1SA and then embedding the insulating layer 2b, such as a silicon oxide ($SiO_2$), in the separation groove 2a. In addition, an insulating layer 3 formed of a silicon oxide, for example, is formed on the main surface of the active region of the substrate 1SA using a thermal oxidation method or the like.

Then, the penetrating separation portion 5 is formed on the substrate 1SA. First as shown in FIG. 3, a resist pattern RA is formed on the main surface of the substrate 1SA by coating a resist film on the main surface of the substrate 1SA using a spin coating method, for example, and performing exposure and development (series of processing including such resist coating, exposure, and development are called a lithographic processing).

Figure 4:
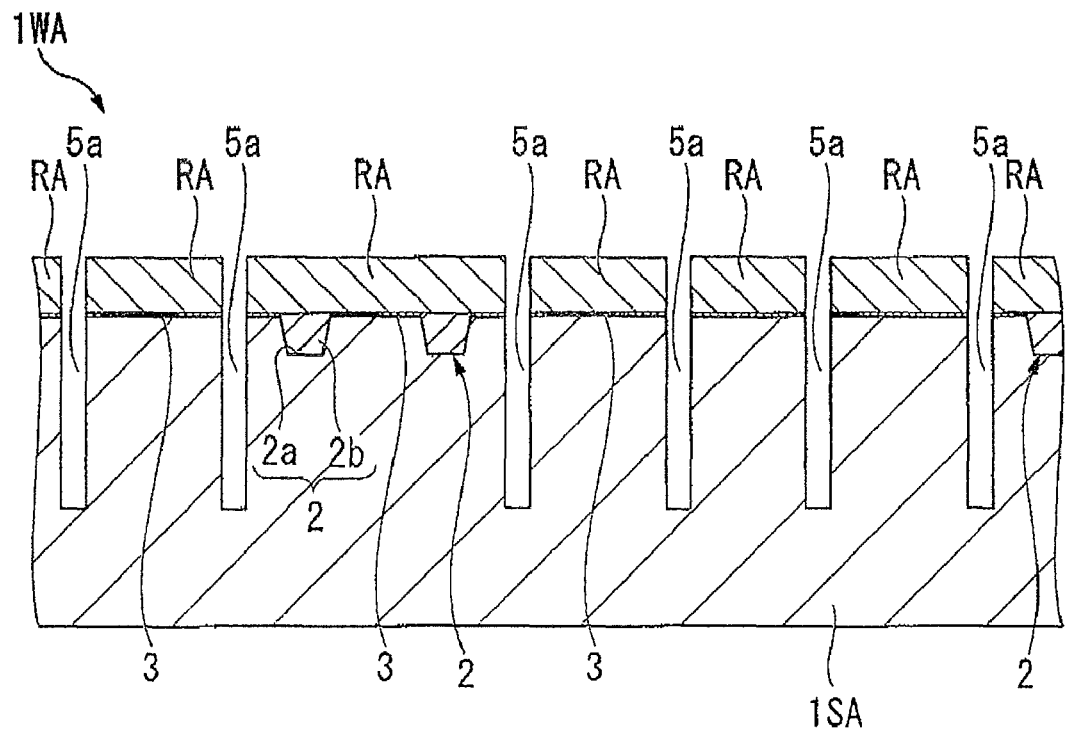
FIG. 4 is a cross-sectional view illustrating the main parts in a manufacturing process of the upper wafer subsequent to FIG. 3.

Then, as shown in FIG. 4, a deep separation groove 5a is formed in the substrate 1SA by etching the insulating layer 3 and the substrate 1SA, which are exposed from the resist pattern RA, using the resist pattern RA as an etching mask. As shown in FIG. 4, the deep separation groove 5a extends from the main surface of the substrate 1SA along a direction crossing (vertically crossing) the main surface (that is, along a thickness direction of the substrate 1SA) and ends at a deeper position than the separation groove 2a for element separation.

Then, an insulating layer formed of a silicon oxide, for example, is formed on an inner side and a bottom surface of the deep separation groove 5a by removing the resist pattern RA and performing thermal oxidation processing on the substrate 1SA. Then, an insulating layer formed of, for example, a silicon oxide or a Low-k (low dielectric constant) material, is flier deposited on the main surface of the substrate 1SA using a CVD (chemical vapor deposition) method or the like and the insulating layer is embedded in the deep separation groove 5a. Then, the excessive insulating layer formed outside the deep separation groove 5a is removed by an etchback method or a CMP (chemical mechanical polishing) method using anisotropic dry etching. As a result, as shown in FIGS. 5 and 6, the penetrating separation portion 5 in which an insulating layer is embedded within the deep separation groove 5a is formed (process 102A in FIG. 20).

Figure 5:
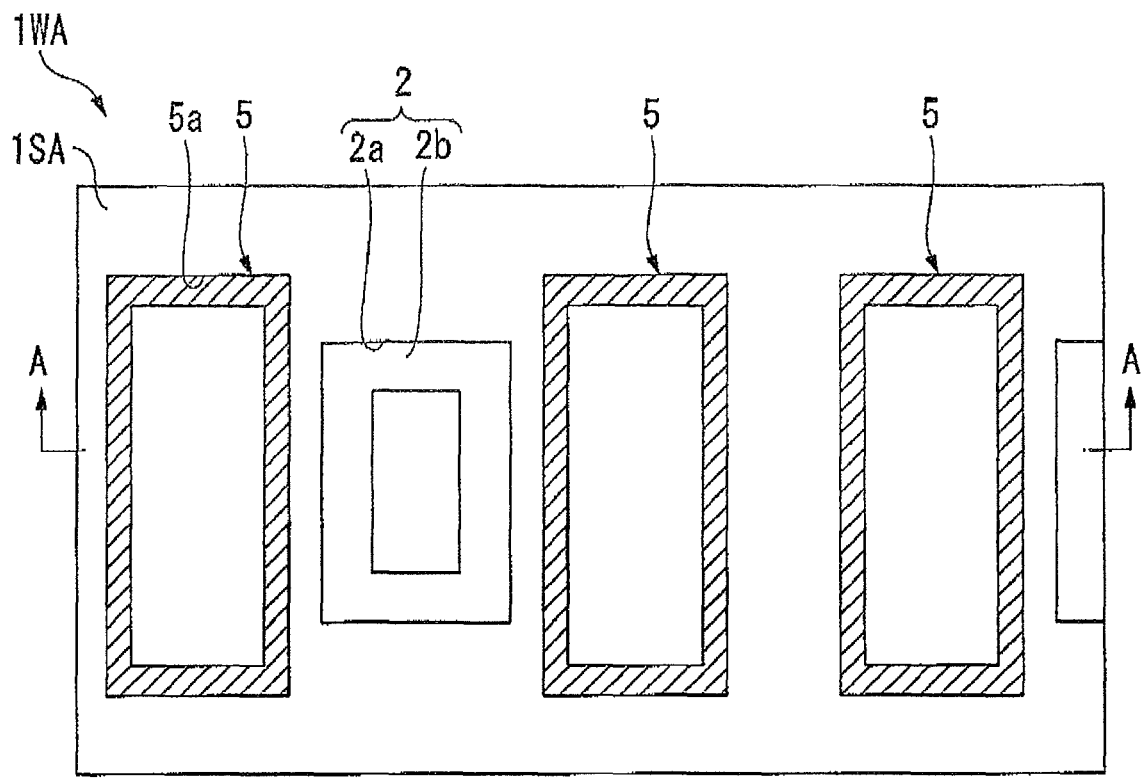
FIG. 5 is a plan view illustrating the main parts in a manufacturing process of the upper wafer subsequent to FIG. 4.
Figure 6:
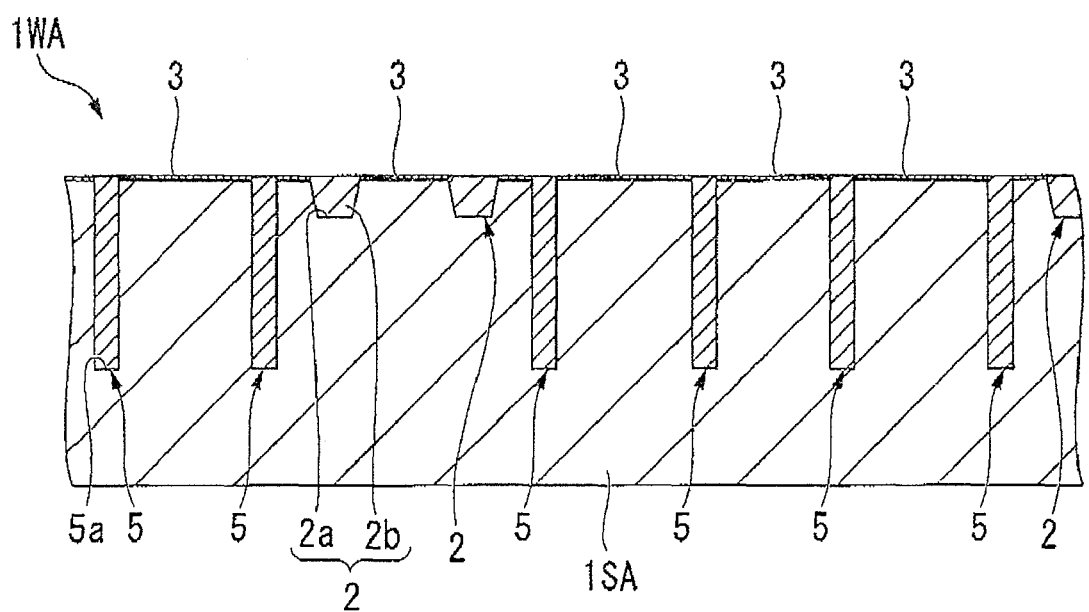
FIG. 6 is a cross-sectional view taken along the A-A of FIG. 5.

FIG. 6 is a cross-sectional view taken along the line A-A of FIG. 5. In addition, FIG. 5 is a plan view, and the penetrating separation portion 5 is shaded in order to make the drawing easy to understand. The penetrating separation portion 5 is formed in rectangular frame shapes in plan view, as shown in FIG. 5. The depth of the penetrating separation portion 5 (that is, the depth of the deep separation groove 5a) may be larger than, the same as, or smaller than those of the penetrating wiring portion 9 (refer to FIG. 10). For example, when the size of the gap between the upper and lower wafers 1WA and 1WB which is a gap between the lamination surfaces 30a and 30b of the upper and lower wafers 1WA and 1WB is controlled by the height of the reinforcing protruding portion 52 and the depths of the penetrating separation portion 5 like the semiconductor device shown in FIG. 19, the depths of the penetrating separation portion 5 may be made larger than those of the penetrating wiring portion 9. In addition, when the size of the gap is controlled by the height of the reinforcing protruding portion 52 and the depths of the penetrating wiring portion 9, the depths of the penetrating separation portion 5 may be made smaller than those of the penetrating wiring portion 9. In addition, the penetrating separation portion 5 may be formed to be as deep as the penetrating wiring portion 9, and the gap may be controlled by only the reinforcing protruding portion 52 or with the reinforcing protruding portion 52.

In addition, when the depths of the penetrating separation portion 5 are made larger than that of the penetrating wiring portion 9 or the depths of the penetrating separation portion 5 are made equal to that of the penetrating wiring portion 9, an excessive load applied to the penetrating wiring portion 9 in laminating the upper and lower wafers 1WA and 1WB together can be prevented, and a variation in load applied to the penetrating wiring portion 9 can be further reduced.

Figure 7:
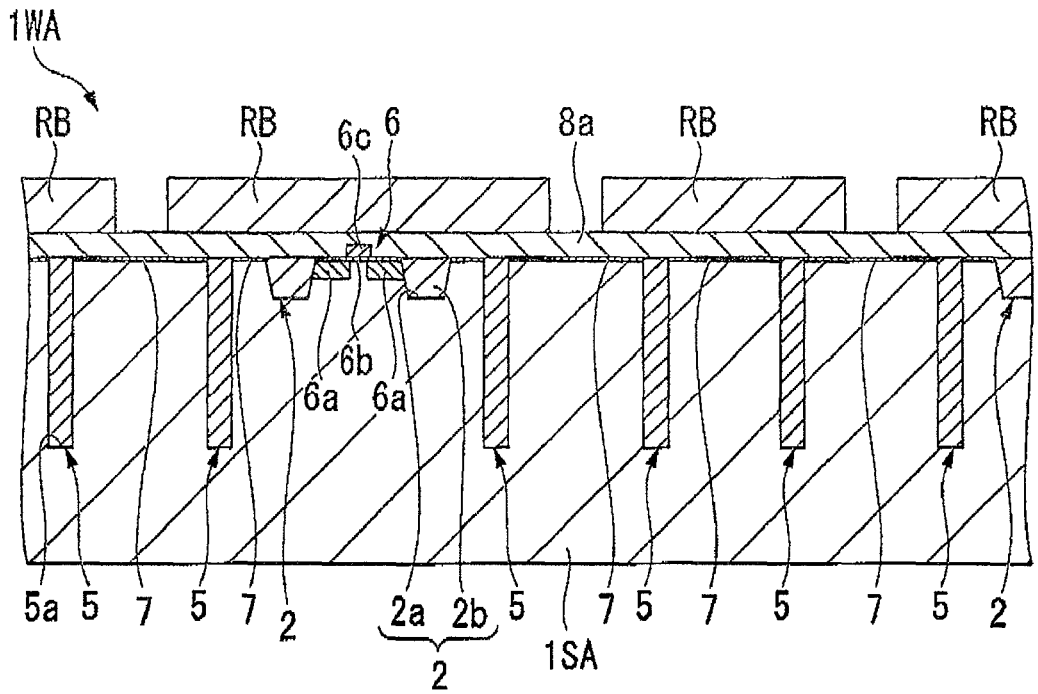
FIG. 7 is a cross-sectional view illustrating the main parts in a manufacturing process of the upper wafer subsequent to FIGS. 5 and 6.

Then, the insulating layer 3 is removed and an element, such as the MOSFET 6 shown in FIG. 7 having the semiconductor region 6a for source and drain, the gate insulating layer 6b, and the gate electrode 6c, is formed in an active region surrounded by the grooved separating portion 2 of the substrate 1SA (process 103A in FIG. 20). Then, the insulating layer 7 which is an insulating layer formed of a silicon oxide, for example, is formed on the main surface of the active region of the substrate 1SA.

In this case, for example, if the penetrating separation portion 5 is formed after the MOSFET 6 is formed, there is a possibility that impurities present in the substrate 1SA (the semiconductor region 6a for source and drain and a channel-forming region below the gate electrode 6c) may be diffused again at the time of thermal oxidation processing for forming the insulating layer that forms the penetrating separation portion 5. As a result, electrical characteristics, such as the threshold voltage, of the MOSFET 6, may be changed. On the other hand, in the present embodiment, since the MOSFET 6 is formed after the penetrating separation portion 5 is formed, a change in the electrical characteristics of the MOSFET 6 caused by the high processing temperature in forming the penetrating separation portion 5 can be prevented. Accordingly, the reliability of the semiconductor device can be improved.

Figure 8:
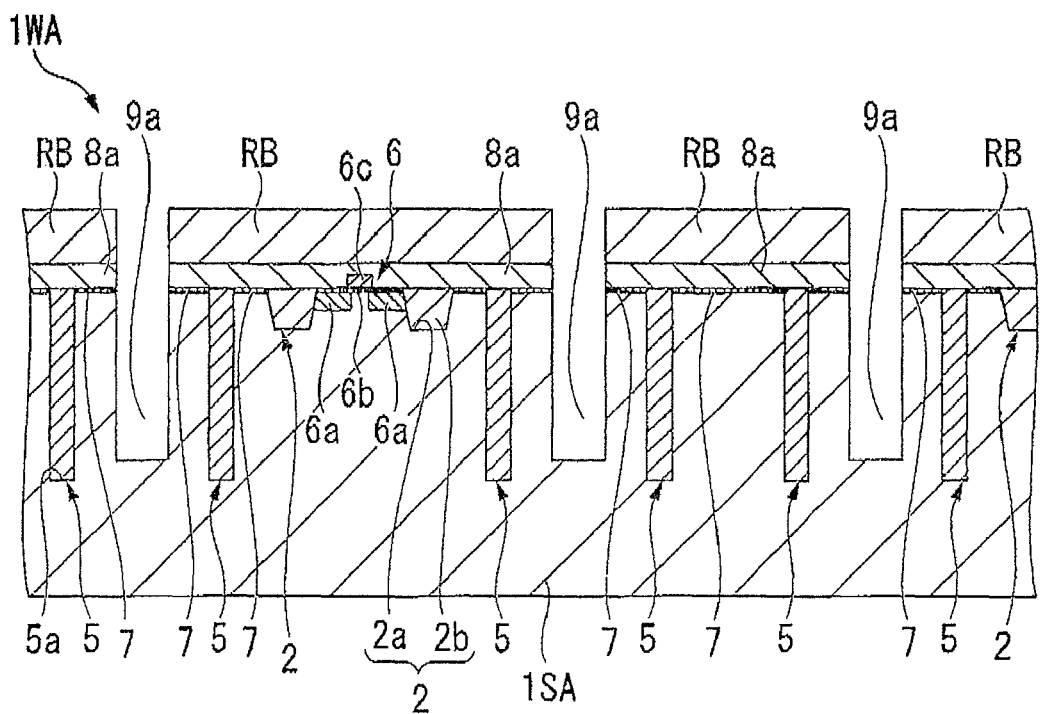
FIG. 8 is a cross-sectional view illustrating the main parts in a manufacturing process of the upper wafer subsequent to FIG. 7.

Then, the penetrating wiring portion 9 is formed. First, the interlayer insulating layer 8a shown in FIG. 7 is formed by depositing an insulating layer formed of, for example, a silicon oxide on the main surface of the substrate 1SA using the CVD method and making an upper surface of the insulating layer flat. Subsequently, a resist pattern RB shown in FIG. 7 is formed on the interlayer insulating layer 8a using lithographic processing. As shown in FIG. 7, the resist pattern RB is formed such that a region where the penetrating wiring portion 9 is formed is exposed and the other regions are covered. Then, as shown in FIG. 8, a deep conductive groove 9a serving as the penetrating wiring portion 9 is formed in substrate 1SA by etching the interlayer insulating layer 8a, the insulating layer 7, and the substrate 1SA, which are exposed from the resist pattern RB, using the resist pattern RB as an etching mask. The deep conductive groove 9a extends from the upper surface of the interlayer insulating layer 8a to the substrate 1SA along a direction crossing (vertically crossing) the upper surface (that is, along the thickness direction of the substrate 1SA) and ends at a deeper position (second position) than the separation groove 2a for element separation as shown in FIG. 8. The depth of the deep conductive groove 9a is the same as those described for the depths of the penetrating separation portion 5. Here, the case where the depth of the deep conductive groove 9a is smaller than that of the deep separation groove 5a is illustrated, as shown in FIG. 8.

Then, the resist pattern RB is removed, and a barrier conductor layer is deposited on the main surface of the substrate 1SA using a sputtering method, for example, and is formed to cover an inner surface (an inner side surface and a bottom surface) of the deep conductive groove 9a. Then, a main conductor layer is embedded in the deep conductive groove 9a by deposition using the CVD method, for example. In addition, the thickness of the main conductor layer is set to be larger than that of the barrier conductor layer. Then, as shown in FIGS. 9 and 10, a conductive portion serving as the penetrating wiring portion 9 is formed by removing the excessive main conductor layer and barrier conductor layer, which are formed outside the deep conductive groove 9a, by polishing using the CMP method, for example, making the main conductor layer and the barrier conductor layer remain only in the deep conductive groove 9a (process 104A in FIG. 20).

Figure 10:
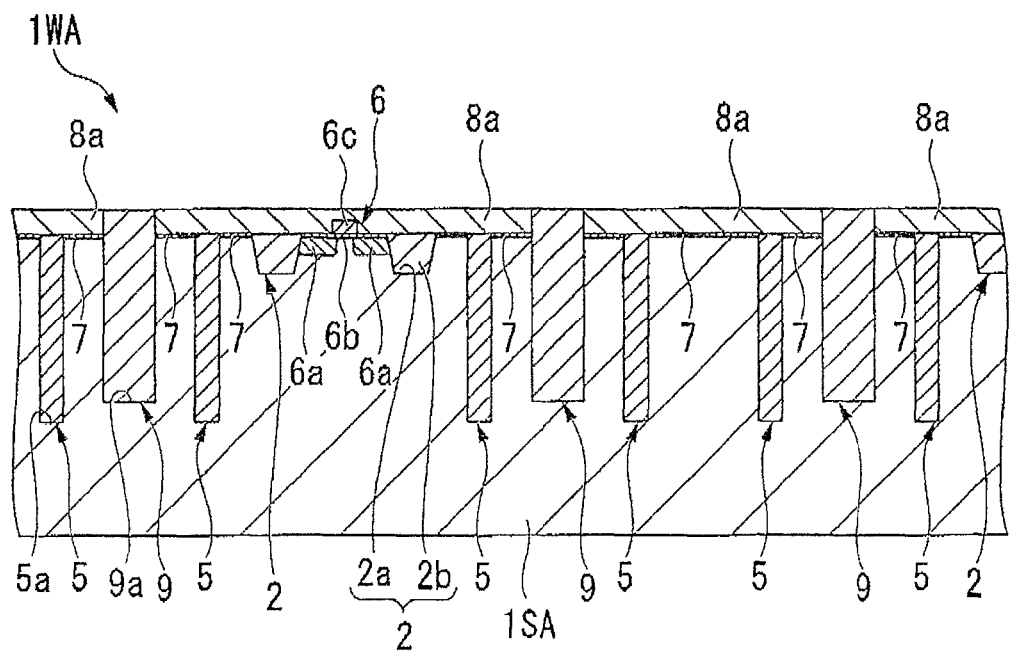
FIG. 10 is a cross-sectional view taken along the A-A of FIG. 9.

FIG. 10 is a cross-sectional view taken along the line A-A of FIG. 9. In addition, FIG. 9 is a plan view, and the penetrating separation portion 5 and the penetrating wiring portion 9 are shaded in order to make the drawing easy to understand. In addition, as shown in FIG. 9, the penetrating wiring portion 9 is formed to have a long rectangular shape in plan view. The penetrating wiring portion 9 is disposed within the frame of the penetrating separation portion 5 in a state of being separated from the penetrating separation portion 5 which has a frame shape in plan view with a predetermined gap therebetween. That is, the penetrating wiring portion 9 is surrounded by the penetrating separation portion 5 which is disposed around the penetrating wiring portion 9 with the predetermined gap therebetween.

Furthermore, although the penetrating separation portion 5 is separately formed in the semiconductor device according to the present embodiment, the penetrating separation portion 5 and the penetrating wiring portion 9 may be unified. However, when the penetrating separation portion 5 and the penetrating wiring portion 9 are unified, the penetrating separation portion 5 and the penetrating wiring portion 9 should be formed in the same process. For this reason, in the case of forming the penetrating separation portion 5 before element formation in order to prevent a change in element characteristics caused by thermal oxidation processing for forming the insulating layer that forms the penetrating separation portion 5, the penetrating wiring portion 9 should also be formed before element formation. However, the possibility of deterioration of element characteristics and metal contamination being high occurs if the penetrating wiring portion 9 is formed before element formation.

On the other hand, in the present embodiment, the penetrating separation portion 5 and the penetrating wiring portion 9 can be separately formed, and the penetrating wiring portion 9 can be formed after the MOSFET 6 and the interlayer insulating layer 8a are formed. Accordingly, the possibility of deterioration of element characteristics and metal contamination can be further reduced. As a result, the reliability of electrical characteristics of the device can be improved. In addition, when the depth of the penetrating separation portion 5 is deeper than the depth of the penetrating wiring portion 9 or the penetrating separation portion 5 is formed to be as deep as the penetrating wiring portion 9, the penetrating separation portion 5 and the penetrating wiring portion 9 are separately formed, and each penetrating wiring portion 9 is surrounded by the penetrating separation portion 5 which is disposed around the penetrating wiring portion 9 with the predetermined gap therebetween. Accordingly, the penetrating wiring portion 9 is effectively reinforced by the penetrating separation portion 5. As a result, according to the present embodiment, damage to the penetrating wiring portion 9 in laminating the upper and lower wafers 1WA and 1WB together can be effectively prevented compared with the case where the penetrating separation portion 5 and the penetrating wiring portion 9 are unified.

In addition, the number of penetrating wiring portions 9 in the penetrating separation portion 5 is not limited to one. For example, a plurality of penetrating wiring portions 9 may be arrayed in parallel within the frame of one penetrating separation portion 5. In addition, the planar shapes of the penetrating separation portion 5 is not limited to the example shown in FIG. 9, and may have other shapes, such as that of a square.

Figure 11:
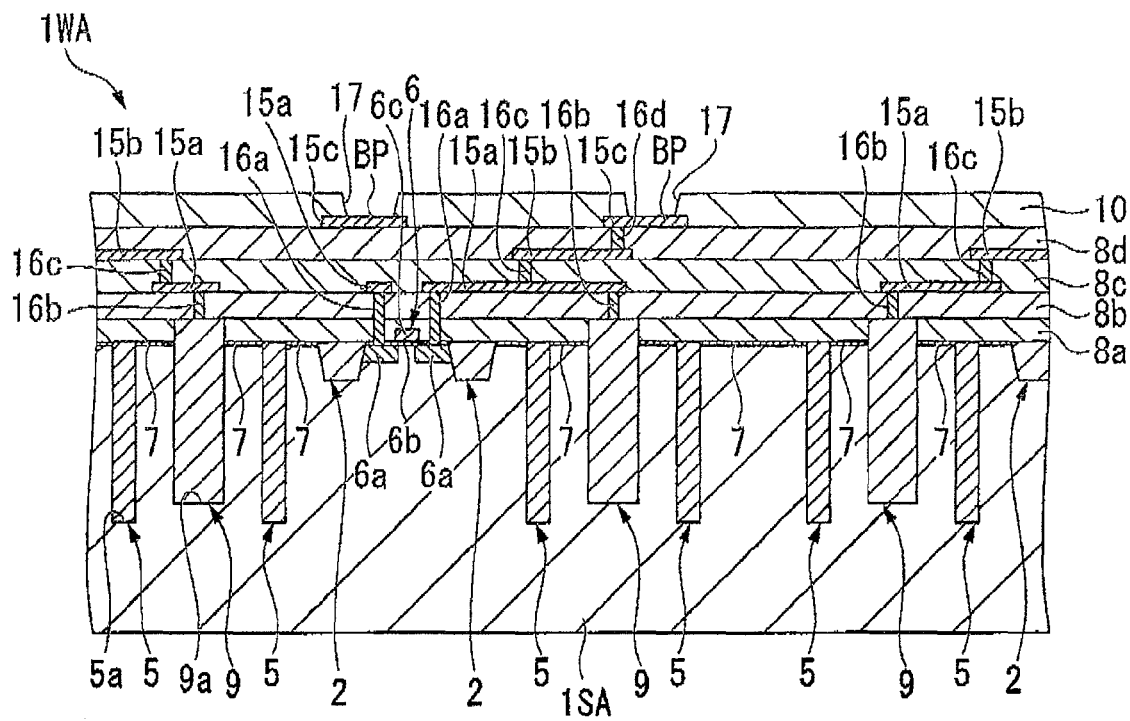
FIG. 11 is a cross-sectional view illustrating the main parts in a manufacturing process of the upper wafer subsequent to FIGS. 9 and 10.

Then, as shown in FIG. 11, a multilayered wiring is formed by forming the interlayer insulating layers 8b, 8c, and 8d, the passivation layer 10, the wiring lines 15a, 15b, and 15c, the plugs 16a, 16b, 16c, and 16d, the opening 17, and the laminating pad BP on the main surface of the substrate 1SA using a normal wiring line-forming method for a semiconductor device (process 105A in FIG. 20).

Figure 12:
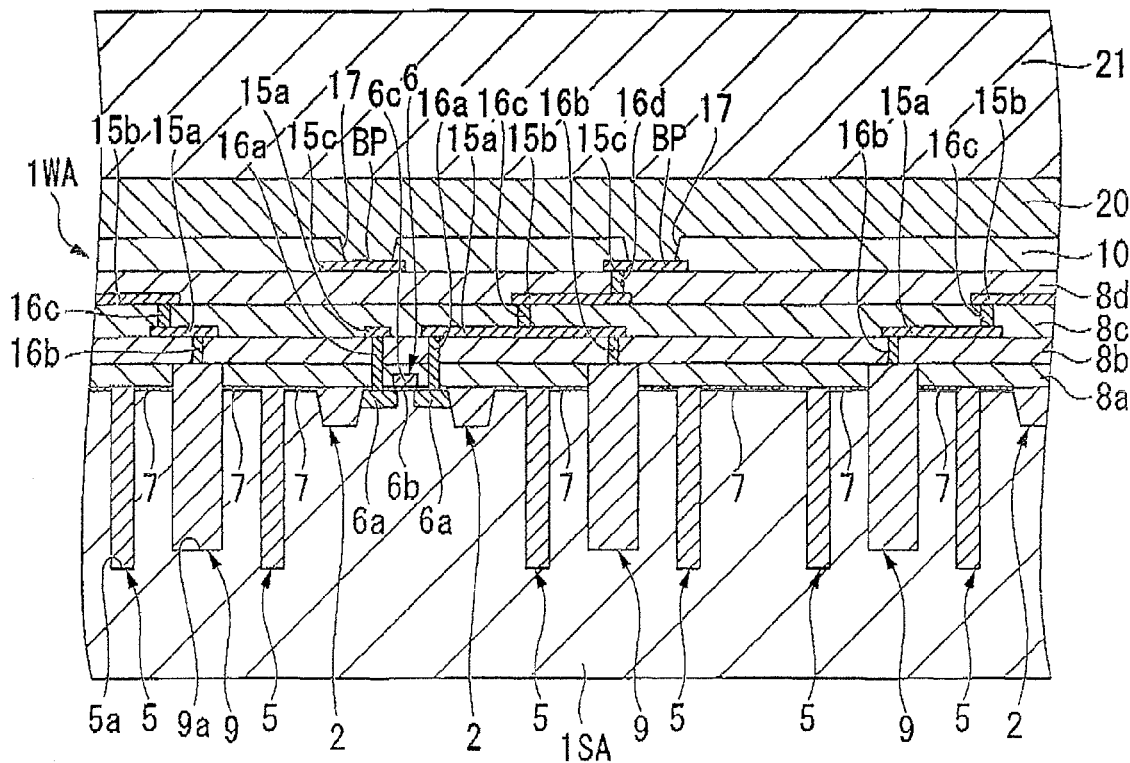
FIG. 12 is a cross-sectional view illustrating the main parts in a manufacturing process of the upper wafer subsequent to FIG. 11.

Then, as shown in FIG. 12, a glass supporting substrate 21 is laminated on the main surface of the wafer 1WA with an adhesive sheet 20. Thus, by laminating the glass support substrate 21 on the main surface of the wafer 1WA, the wafer 1WA can be stably handled and the mechanical strength of the thin wafer 1WA after subsequent thinning processing can be secured. Then, the thinning processing is performed on the wafer 1WA (process 107 in FIG. 20). The dinning processing on the wafer 1WA in the present embodiment includes first thinning processing, second thinning processing, and third thinning processing, which will be described below.

Figure 13:
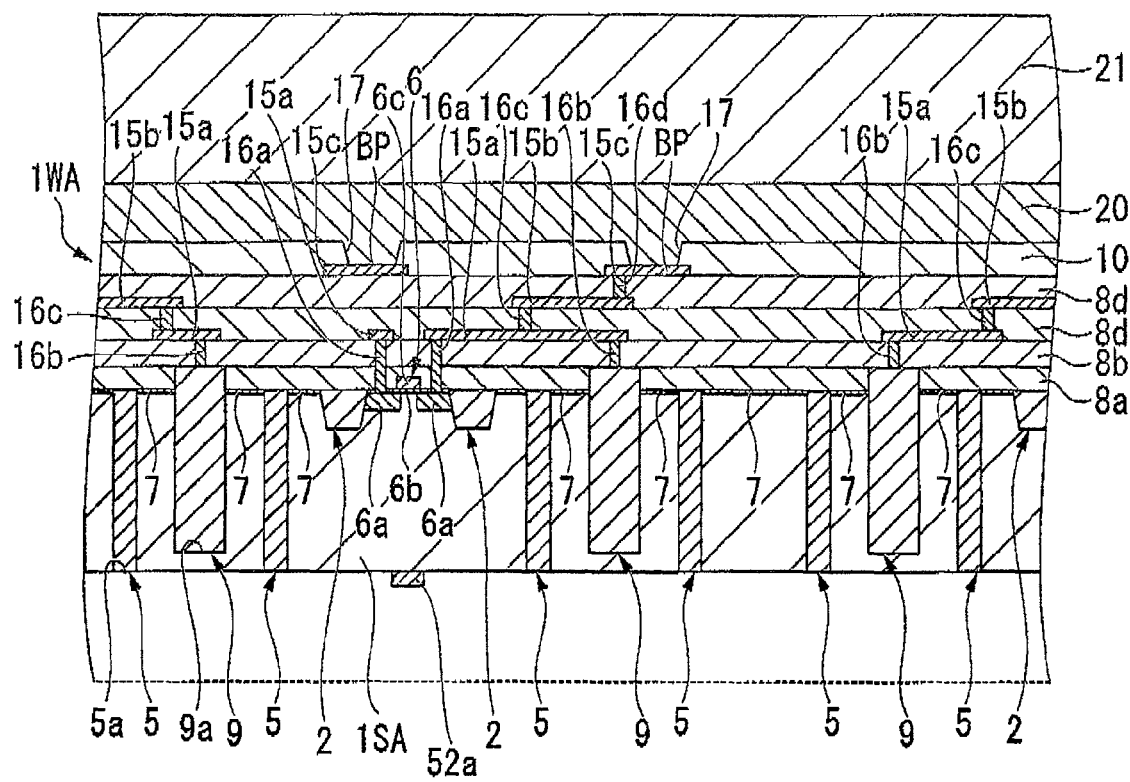
FIG. 13 is a cross-sectional view illustrating the main parts of the upper wafer after first thinning processing subsequent to FIG. 12.

The dotted line shown in FIG. 13 indicates the substrate 1SA before the first thinning processing. In the first thinning processing, a bottom surface (that is, a bottom surface of the substrate 1SA) of the wafer 1WA is ground until the bottom surface has a desired thickness in a state where the glass support substrate 21 is fixed to the main surface of the wafer 1WA, as shown in FIG. 13. The first thinning processing is thinning processing related to a mechanical element, as illustrated by grinding. The first thinning processing is ended before reaching the penetrating separation portion 5 and the penetrating wiring portion 9 (that is, in a state where the penetrating separation portion 5 and the penetrating wiring portion 9 are not exposed from the bottom surface of the wafer 1WA).

Then, grinding processing as a second thinning processing is performed on the bottom surface of the wafer 1WA. The second thinning processing is thinning processing related to both a mechanical element and a chemical element, such as CMP, as illustrated by polishing. FIG. 13 is a cross-sectional view illustrating the main parts of the upper wafer 1WA after the second thinning processing. As shown in FIG. 13, the second thinning processing is ended when reaching the penetrating separation portion 5 and before reaching the penetrating wiring portion 9 (that is, in a state where the penetrating separation portion 5 is exposed from the bottom surface of the wafer 1WA, and the penetrating wiring portion 9 is not exposed from the bottom surface of the wafer 1WA).

By performing the first and second thinning processing, the time taken for wafer thinning processing can be shortened. In addition, by performing the second thinning processing, a damaged layer generated on the bottom surface of the wafer 1WA by grinding in the first thinning processing can be removed and the bottom surface of the wafer 1WA can be made smooth. Accordingly, the chemical stability of the bottom surface of the wafer 1WA can be made uniform. As a result, the etched amount of the entire bottom surface of the wafer 1WA in the thickness direction of the wafer 1WA can be made uniform at the time of subsequent etching processing (third thinning processing) on a bottom surface portion of the wafer 1WA.

In the third thinning processing, firstly, a resist pattern 52a is formed by lithographic processing on the substrate 1SA which forms the bottom surface of the wafer 1WA after the second thinning processing. The resist pattern 52a is formed in an area where the penetrating separation portion 5 and the penetrating wiring portion 9 are not overlapped in plan view, on the substrate 1SA which forms the bottom surface of the wafer 1WA. The resist pattern 52a is formed so as to expose forming areas of the penetrating separation portion 5 and the penetrating wiring portion 9 and to cover a forming area of the reinforcing protruding portion 52. Then, the bottom surface of the wafer 1WA is dipped into the chemical to perform etching (wet etching, dry etching, or both of them) of the substrate 1SA which is exposed from the resist pattern 52a as etching mask in a state where the glass support substrate 21 is fixed to the main surface of the wafer 1WA. As a result, as shown in FIG. 14, the penetrating wiring portion 9 which is the protruding connecting portion protruding from the lamination surface is formed by exposing an end 9c of the penetrating wiring portion 9 from the bottom surface of the wafer 1WA, and the reinforcing protruding portion 52 which is a part of the substrate 1SA a is formed.

Figure 14:
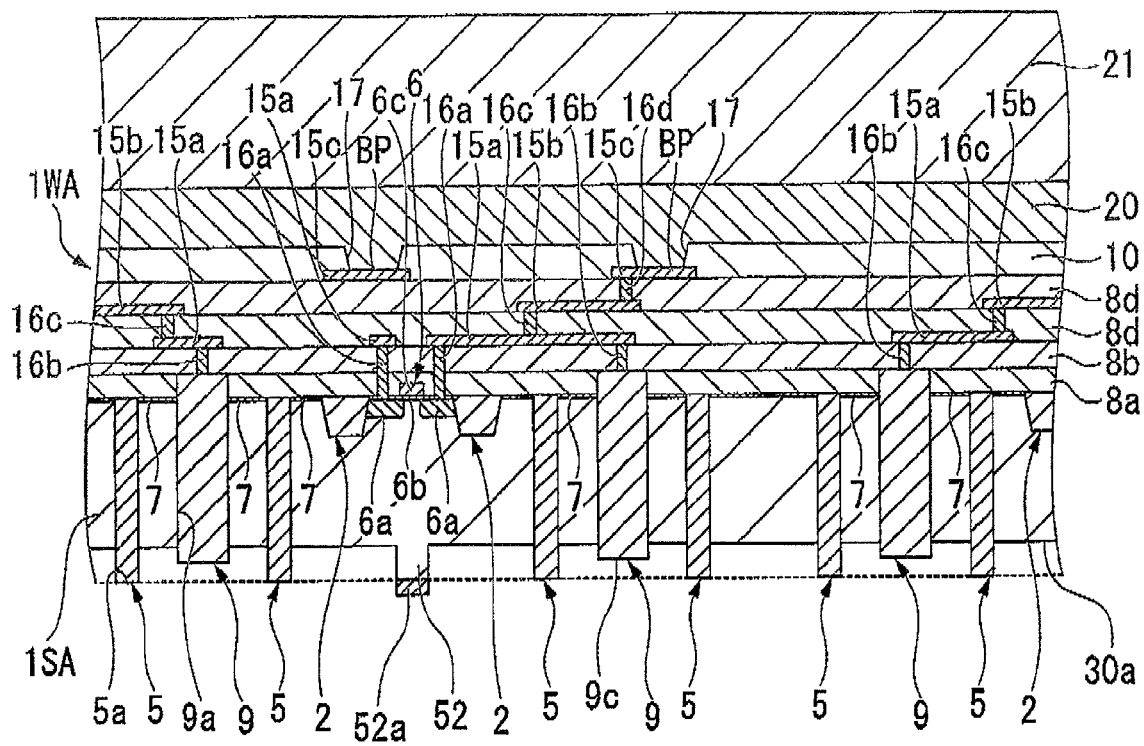
FIG. 14 is a cross-sectional view illustrating the main parts of the upper wafer after second thinning processing subsequent to FIG. 13.

FIG. 14 is a cross-sectional view illustrating the main parts of the upper wafer 1WA after the third thinning processing. The dotted line shown in FIG. 14 indicates the substrate 1SA before the third thinning processing. As shown in FIG. 14, in the upper wafer 1WA after the third thinning processing, some of the lower portions of the penetrating separation portion 5 and the penetrating wiring portion 9 and the reinforcing protruding portion 52 protrude to be exposed by a desired length from the bottom surface of the wafer 1WA after the third thinning processing, which is the lamination surface 30a. As shown in FIG. 14, the protruding length of the reinforcing protruding portion 52 protruding from the bottom surface of the wafer 1WA is the same as the penetrating separation portion 5, and the protruding length of the reinforcing protruding portion 52 is longer the length of the end 9c of the penetrating wiring portion 9 by the thickness of the bump 26 after laminating. Protruding lengths of the penetrating separation portion 5, the penetrating wiring portion 9, and the reinforcing protruding portion 52 which protrude from the bottom surface of the wafer 1WA are not limited to only the example illustrated in FIG. 14, they can be suitably determined in consideration of the gap between the lamination surfaces 30a and 30b of the upper and lower wafers 1WA and 1WB.

By the third thinning processing, the penetrating wiring portion 9 is separated from the substrate 1SA by the penetrating separation portion 5 in the side surface direction. In addition, since the penetrating wiring portion 9 is exposed at the lower portion of the penetrating wiring portion 9, the penetrating wiring portion 9 is separated from the substrate 1SA. As a result, the penetrating wiring portion 9 is completely electrically separated from the substrate 1SA. In addition, the deep separation groove 5a and the deep conductive groove 9a in this stage become holes passing between the main and bottom surfaces of the substrate 1SA.

Moreover, in the above example, a case where the first thinning processing (grinding), the second thinning processing (polishing), and the third thinning processing (etching) are performed sequentially in the processing for making the wafer 1WA thin has been described. However, for example, the first thinning processing (grinding) or the second thinning processing (polishing) may be excluded.

Thus, the manufacturing process of the upper wafer 1WA is completed.

Next, a manufacturing process of a lower wafer will be described. Here, a manufacturing process (manufacturing process of lower wafers of second and subsequent layers in FIG. 20) of the lowermost wafer with a bottom surface to which other wafers are not laminated, for example, as a lower wafer will be described. The manufacturing process of the lower wafer which is the lowermost wafer is almost the same as the manufacturing process (processes 100A to 107A in FIG. 20) of the upper wafer 1WA. Here, the manufacturing process of the lowermost wafer is different from that of the upper wafer 1WA in that a bump-forming process (process 106B) is performed after a process (process 105B) of forming a multilayered wiring layer shown in FIG. 20 and a wafer thinning process (process 107A), a process (process 102B) of forming a penetrating separation portion, and a process (process 104B) of forming a penetrating wiring portion are not performed.

Figure 15:
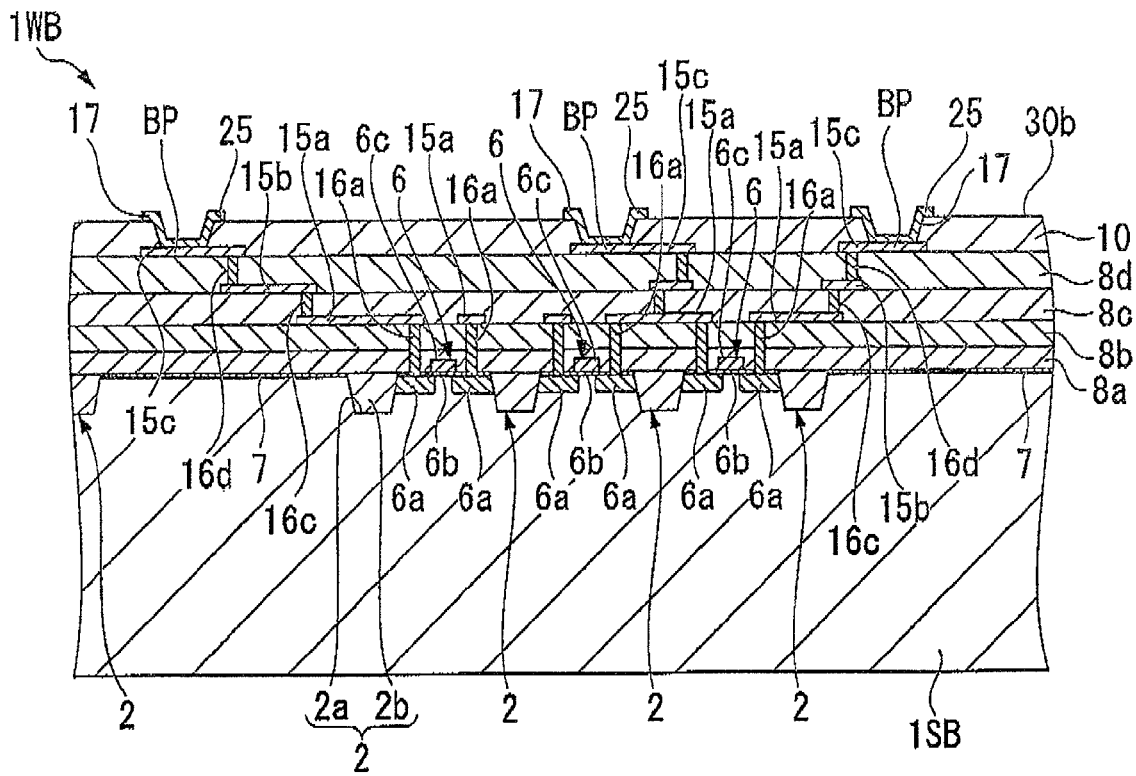
FIG. 15 is a cross-sectional view illustrating the main parts of a lower wafer in a stage of a bump forming process.

FIG. 15 is a cross-sectional view illustrating the main parts of the lower wafer (lowermost wafer) 1WB in stages of a process 100B in FIG. 20 to the bump-forming process 106B through the process 105B (process 102B and process 104B in FIG. 20 are not performed). After the process 105B of forming a multilayered wiring layer, the bump base conductor pattern 25 is formed by depositing a conductor layer on the main surface of the wafer 1WB using a sputtering method, for example, and patterning the conductor layer using lithographic processing and etching processing.

Figure 16:
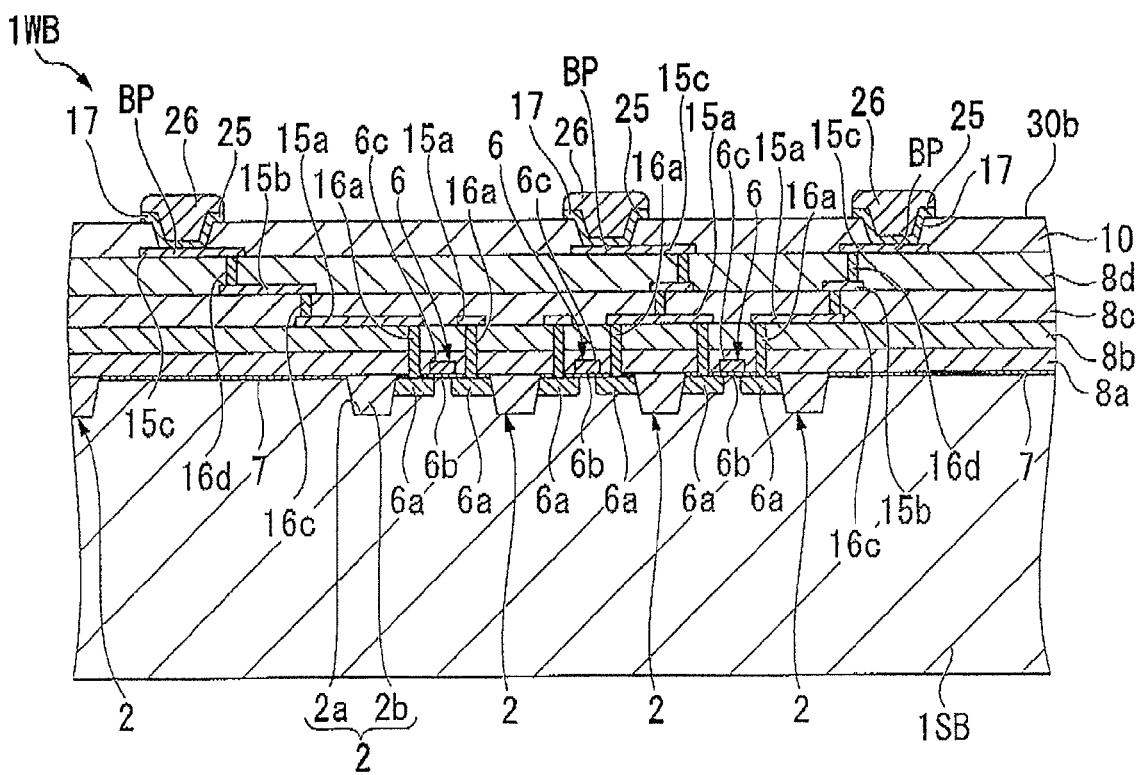
FIG. 16 is a cross-sectional view illustrating the main parts in a manufacturing process of the lower wafer subsequent to FIG. 15.

Then, as shown in FIG. 16, a bump 26 is formed on the bump base conductor pattern 25 exposed on the main surface of the lower wafer 1WB, which is the lamination surface 30b, using a lift-off method, an electrolytic plating method, a printing method, or a ball dropping method, for example. The bump 26 is formed to protrude from the lamination surface 30b. Thus, the manufacturing process of the lower wafer 1WB is completed.

Figure 17:
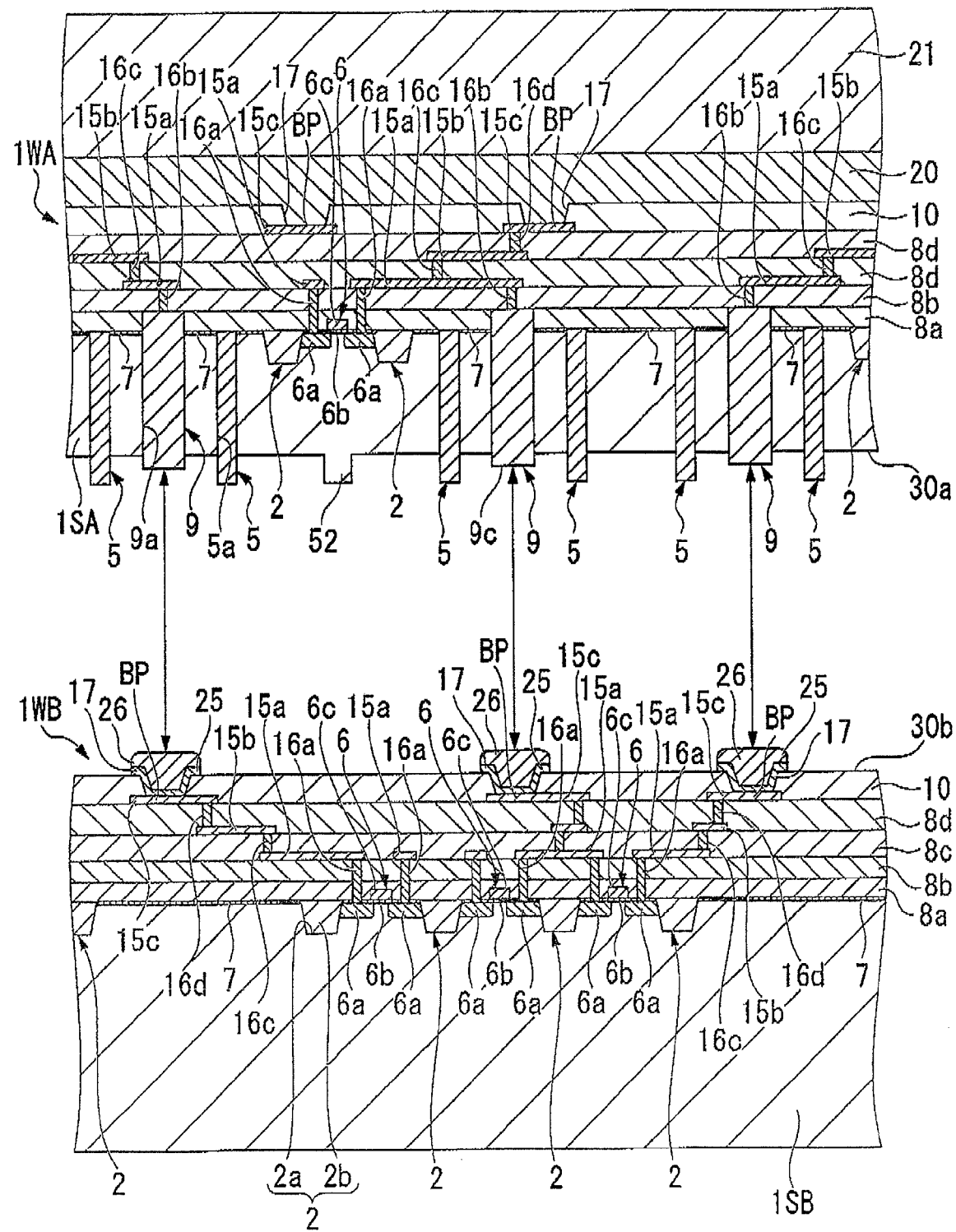
FIG. 17 is a cross-sectional view illustrating the main parts in a process of laminating upper and lower wafers together.

Then, the upper and lower wafers 1WA and 1WB manufactured as described above are laminated together (laminating process of upper and lower wafers of first and second layers in FIG. 20). First, as shown in FIG. 17, the lower wafer 1WB shown in FIG. 16 is fixed and then the upper wafer 1WA shown in FIG. 14 is disposed on the main surface (lamination surface 30b) of the lower wafer 1WB such that the bottom surface (lamination surface 30a) faces the main surface of the lower wafer 1WB.

Then, relative positioning between the lower wafer 1WB and the upper wafer 1WA is performed. Specifically positioning of the bump 26 on the main surface of the lower wafer 1WB and the penetrating wiring portion 9 of the bottom surface of the upper wafer 1WA corresponding to the bump 26 is performed (process 201 in FIG. 20). Thereafter, as shown in FIG. 18, the opposite surfaces (lamination surfaces 30a and 30b) of the upper and lower wafers 1WA and 1WB are brought close to each other to make the upper wafer 1WA and the lower wafer 1WB overlap each other. Then, the bump 26 on the main surface of the lower wafer 1WB and the penetrating wiring portion 9 of the bottom surface of the upper wafer 1WA are brought into contact with each other to be electrically connected. Thus, semiconductor circuit portions of the upper and lower wafers 1WA and 1WB are electrically connected to each other, forming a desired semiconductor circuit (process 202 in FIG. 20).

Here, each bump 26 on the main surface of the lower wafer 1WB is settled within the frame of the penetrating separation portion 5 that surrounds the periphery of the penetrating wiring portion 9 of the bottom surface of the upper wafer 1WA to which the bump 26 is connected.

In addition, the bump 26 is connected to the penetrating wiring portion 9, and the penetrating wiring portion 9 may not be settled within the frame of the penetrating separation portion 5. In this case, it is preferable that a gap between the lamination surface 30a and the lamination surface 30b be set sufficiently larger than the height of the bump 26, the wafer 1WA and the bump 26 be made so as not to be in contact with each other.

Then, the insulating adhesive 30 is injected between the opposite lamination surfaces 30a and 30b of the upper and lower wafers 1WA and 1WB (process 203 in FIG. 20). Then, the glass support substrate 21 is peeled off from the main surface of the upper wafer 1WA. This is the semiconductor device shown in FIG. 19.

A chip is obtained by cutting the semiconductor device shown in FIG. 19 in the unit of a chip after the above-described processes. The chip obtained as described above has a three-dimensional configuration in which a plurality of wafers is laminated to overlap. That is, in this chip, the semiconductor circuits formed in the wafers, which form the chip, are electrically connected to each other through the penetrating wiring portion 9 and the bump 26. As a result, one desired semiconductor integrated circuit is formed.

In the semiconductor device according to the present embodiment, the upper and lower wafers 1WA and 1WB which are formed by the substrates 1SA and 1SB with formed elements are laminated to each other. An electric signal connecting portion formed by the end 9c of the penetrating wiring portion 9 is provided on the lamination surface 30a of the upper wafer 1WA facing the lower wafer 1WB, and an electric signal connecting portion formed by the bump 26 is provided on the lamination surface 30b of the lower wafer 1WB facing the upper wafer 1WA. The desired semiconductor circuit is formed by electrically connecting the end 9c of the penetrating wiring portion 9 of the upper wafer 1WA with the bump 26 of the lower wafer 1WB. Furthermore, in the semiconductor device according to the present embodiment, the penetrating wiring portion 9 of the upper wafer 1WA is a protruding connection portion having the end 9c that is formed to protrude from the lamination surfaces 30a which exposes the substrate 1SA. In addition, in an area where the penetrating wiring portion 9 is not disposed on the lamination surface 30a, the reinforcing protruding portion 52 which is formed of the same material as the substrate 1SA, and is insulated from the semiconductor circuit, and protrudes from the lamination surface 30a to have the same height as the length of the gap between the wafers 1WA and 1WB is formed. Accordingly, since the load applied to the penetrating wiring portion 9 and the bump 26 is also applied to the reinforcing protruding portion 52 when laminating the upper and lower wafers 1WA and 1WB together, a variation in load applied to the penetrating wiring portion 9 and the bump 26 is reduced. As a result, damage to the penetrating wring portion 9 and the bump 26 occurring when laminating the upper and lower wafers 1WA and 1WB together can be effectively prevented.

In addition, a method of manufacturing the semiconductor device according to the present embodiment includes: a process of forming the penetrating wiring portion 9, which protrudes from the lamination surface 30a which exposes the substrate 1SA, on the lamination surface 30a of the wafer 1WA; a process of forming the reinforcing protruding portion 52 which is formed of the same material as the substrate 1SA, is insulated from a semiconductor circuit, and protrudes from the lamination surface 30a to have the same height as the length of the gap between the wafers 1WA and 1WB laminated to each other; and a process of forming a desired semiconductor circuit by laminating the upper and lower wafers 1WA and 1WB together and electrically connecting the penetrating wiring portion 9 of the upper wafer 1WA with the bump 26 of the lower wafer 1WB. Accordingly, since the load applied to the penetrating wiring portion 9 and the bump 26 is also applied to the reinforcing protruding portion 52 when laminating the upper and lower wafers 1WA and 1WB together, the variation in load applied to the penetrating wiring portion 9 and the bump 26 is reduced. Thus, according to the present embodiment, damage to the penetrating wiring portion 9 and the bump 26 occurring when laminating the upper and lower wafers 1WA and 1WB together can be effectively prevented. As a result, the semiconductor device which has excellent reliability and stable performance can be realized.

In addition, in a method of manufacturing the semiconductor device according to the present embodiment, forming the penetrating wiring portion 9 and the reinforcing protruding portion 52 includes: forming conductive portions, which become the penetrating wiring portion 9, by forming a groove in main surface of the wafer 1SA and embedding a conductive layer in the groove; and forming the penetrating wiring portion 9 which protrudes from the lamination surface 30a by exposing a part of a conductive portion by etching the substrate 1SA from the bottom surface selectively and forming the reinforcing protruding portion 52 which is a part of the substrate 1SA and has a column-like shape. Accordingly, forming the reinforcing protruding portion 52 and forming the penetrating wiring portion 9 can be simultaneously performed. As a result, according to the present embodiment, the reinforcing protruding portion 52 can be efficiently manufactured compared with a case where the penetrating wiring portion 9 and the reinforcing protruding portion 52 are separately formed.

Figure 21:
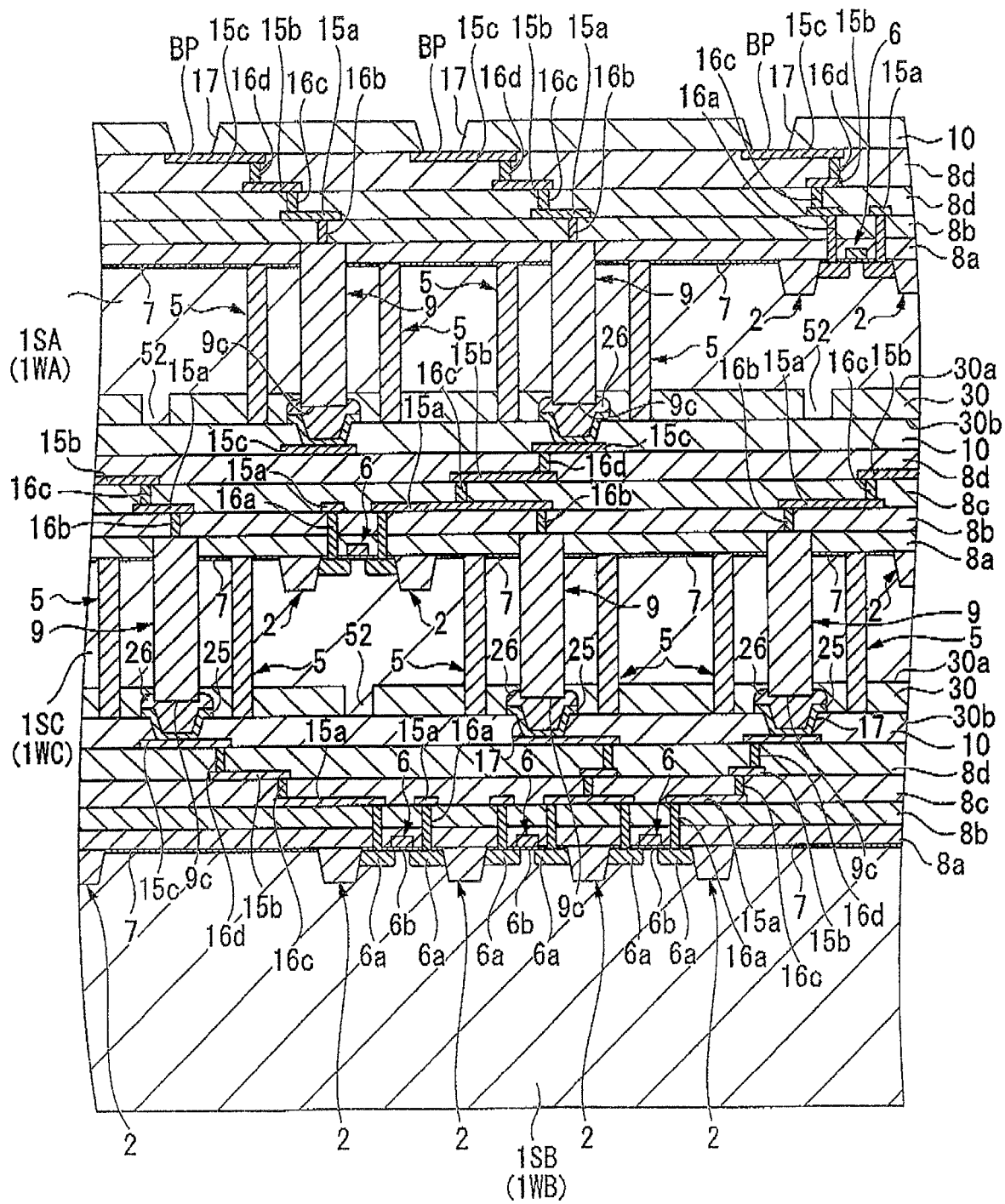
FIG. 21 is a cross-sectional view illustrating the main parts in another example of the semiconductor device of the invention.

In addition, the invention is not limited to only the example described above. For example, the number of wafers laminated may be three or more, even though the semiconductor device in which two wafers 1WA and 1WB are laminated together has been described in the example shown in FIG. 19. FIG. 21 is a cross-sectional view illustrating the main parts in another example of the semiconductor device of the invention. The semiconductor device shown in FIG. 21 is a three-dimensional semiconductor device with a multilayer laminating configuration in which substrates 1SA, 1SB, and 1SC are laminated so as to make three layers. Moreover, in the semiconductor device shown in FIG. 21, the same members as in FIG. 19 are denoted by the same reference numerals, and an explanation thereof will be omitted.

Next, an example of a manufacturing process of the semiconductor device shown in FIG. 21 will be described with reference to FIG. 20. First, the upper wafer 1WA is prepared as described in FIGS. 3 to 14. In addition, the lowermost wafer 1WB is prepared as described in FIGS. 15 and 16.

In addition, a middle wafer 1WC is prepared through the processes 100B to 106B in FIG. 20. The penetrating separation portion 5, the penetrating wiring portion 9, and the reinforcing protruding portion 52 are formed in the middle wafer 1WC, similar to the uppermost wafer 1WA. The middle wafer 1WC is different from the uppermost wafer 1WA in that the bump base conductor pattern 25 and the bump 26 are formed on a main surface of the middle wafer 1WC.

In addition, the middle wafer 1WC in his stage is still thick because the first to third thinning processings have not been performed.

Then, in the same manner as described in FIGS. 17 and 18, two wafers 1WA and 1WC are laminated together by overlapping the wafers 1WA and 1WC and injecting the adhesive 30 between the wafers 1WA and 1WC (laminating process of upper and lower wafers of third and subsequent layers in FIG. 20). At this time, since the middle wafer 1WC is still thick, the wafer 1WC can be handled stably and easily.

Then, the middle wafer 1WC at the lower side is made thin from the bottom surface side by the same thinning processing described in FIGS. 13 and 14 in a state where the glass support substrate 21 is laminated to the main surface of the uppermost wafer 1WA (process 107A for the middle in FIG. 20). As a result, the penetrating separation portion 5 and the penetrating wiring portion 9 are exposed from (protrude from) the bottom surface (lamination surface 30a) of the middle wafer 1WC at the lower side, and the reinforcing protruding portion 52 is formed to protrude. Since the process of making the middle wafer 1WC thin is performed in a state where the two wafers 1WA and 1WC are laminated together, the mechanical strength of the wafer 1WC at the time of thinning processing can be secured and the stability in handling the wafer 1WC can be improved.

Then, the middle wafer 1WC and the lowermost wafer 1WB are laminated together by overlapping the middle wafer 1WC and the lowermost wafer 1WB with each other and injecting the adhesive 30 between the wafers 1WC and 1WB in a state where the glass support substrate 21 is laminated to the main surface of the uppermost wafer 1WA, in the same manner as described in FIGS. 17 and 18 (processes 201 to 203 of a middle lower portion in FIG. 20). Since the subsequent processes are the same as those described above, an explanation thereof will be omitted. In the case of laminating four or more layers together; the process performed for the middle wafer 1WC and the wafer laminating process are preferably performed repeatedly.

In the semiconductor device shown in FIG. 21, the penetrating wiring portion 9 is a protruding connection portion that is formed to protrude from the lamination surfaces 30a which exposes the substrate 1SA. In addition, in an area where the penetrating wiring portion 9 is not disposed on the lamination surface 30a, the reinforcing protruding portion 52 which is formed of the same material as the substrate 1SA is insulated from the semiconductor circuit and protrudes from the lamination surface to have the same height as the length of the gap between the wafers is formed. Accordingly, since the load applied to the penetrating wiring portion 9 and the bump 26 is also applied to the reinforcing protruding portion 52 when laminating the wafers 1WA, 1WB, and 1WC together, the variation in load applied to the penetrating wiring portion 9 and the bump 26 is reduced. As a result, damage to the penetrating wiring portion 9 and the bump 26 occurring when laminating the wafers 1WA, 1WB, and 1WC together can be effectively prevented. Thus, a semiconductor device which has excellent reliability and stable performance can be realized.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device having a plurality of wafers which are laminated to each other, wherein:
   each wafer includes a lamination surface to which another wafer is laminated and a substrate having an element formed thereon;
   the lamination surface is provided with an electric signal connecting portion that electrically connects to said another wafer so as to form a semiconductor circuit;
   at least one of the electrical signal connecting portions facing each other is a protruding connection portion that protrudes from a region which exposes the substrate having the protruding connection portion on the lamination surface; and
   a reinforcing protruding portion that is insulated from the semiconductor circuit, and is formed of the same material as that of the substrate from which the reinforcing protruding portion is formed to protrude from the lamination surface with a height equal to the length of a gap between the lamination surfaces of wafers facing each other is provided in an area where the protruding connection portion is not disposed on the lamination surface formed with the protruding connection portion.

2. The semiconductor device according to claim 1, wherein a plurality of the reinforcing protruding portions is disposed so as to surround the one protruding connection portion.

3. A method of manufacturing the semiconductor device according to claim 2, comprising:
   forming the protruding connection portion which protrudes from a region which exposes the substrate having the protruding connection portion on the lamination surface of at least one of the plurality of wafers;
   forming the reinforcing protruding portion that is insulated from the semiconductor circuit and is formed of the same material as that of the substrate from which the reinforcing protruding portion is formed to protrude from the lamination surface with a height equal to the length of a gap between the lamination surfaces of wafers facing each other in an area where the protruding connection portion is not disposed on the lamination surface formed with the protruding connection portion; and
   forming the semiconductor circuit by laminating the plurality of wafers together and electrically connecting the electric signal connecting portions of each wafer.

4. The semiconductor device according to claim 1, wherein a plurality of protruding connection portions are disposed adjacent to each other to thereby form a protruding connection portion group, and a plurality of the reinforcing protruding portions is disposed so as to surround the protruding connection portion group.

5. A method of manufacturing the semiconductor device according to claim 4, comprising:
   forming the protruding connection portion which protrudes from a region which exposes the substrate having the protruding connection portion on the lamination surface of at least one of the plurality of wafers;
   forming the reinforcing protruding portion that is insulated from the semiconductor circuit and is formed of the same material as that of the substrate from which the reinforcing protruding portion is formed to protrude from the lamination surface with a height equal to the length of a gap between the lamination surfaces of wafers facing each other in an area where the protruding connection portion is not disposed on the lamination surface formed with the protruding connection portion; and
   forming the semiconductor circuit by laminating the plurality of wafers together and electrically connecting the electric signal connecting portions of each wafer.

6. The semiconductor device according to claim 1, wherein
   a plurality of protruding connection portions are disposed adjacent to each other to thereby form two or more protruding connection portion groups, and
   a plurality of the reinforcing protruding portions is disposed so as to surround the two or more protruding connection portion groups formed adjacent to each other.

7. A method of manufacturing the semiconductor device according to claim 6, comprising:
   forming the protruding connection portion which protrudes from a region which exposes the substrate having the protruding connection portion on the lamination surface of at least one of the plurality of wafers;
   forming the reinforcing protruding portion that is insulated from the semiconductor circuit and is formed of the same material as that of the substrate from which the reinforcing protruding portion is formed to protrude from the lamination surface with a height equal to the length of a gap between the lamination surfaces of wafers facing each other in an area where the protruding connection portion is not disposed on the lamination surface formed with the protruding connection portion; and
   forming the semiconductor circuit by laminating the plurality of wafers together and electrically connecting the electric signal connecting portions of each wafer.

8. The semiconductor device according to claim 1, wherein at least one of the electric signal connecting portions is an end of a penetrating wiring portion which makes respective directly contacting surfaces with the end electrically conductive.

9. A method of manufacturing the semiconductor device according to claim 8, comprising:
   forming the protruding connection portion which protrudes from a region which exposes the substrate having the protruding connection portion on the lamination surface of at least one of the plurality of wafers;
   forming the reinforcing protruding portion that is insulated from the semiconductor circuit and is formed of the same material as that of the substrate from which the reinforcing protruding portion is formed to protrude from the lamination surface with a height equal to the length of a gap between the lamination surfaces of wafers facing each other in an area where the protruding connection portion is not disposed on the lamination surface formed with the protruding connection portion; and
   forming the semiconductor circuit by laminating the plurality of wafers together and electrically connecting the electric signal connecting portions of each wafer.

10. A method of manufacturing the semiconductor device according to claim 1, comprising:
    forming the protruding connection portion which protrudes from a region which exposes the substrate having the protruding connection portion on the lamination surface of at least one of the plurality of wafers;
    forming the reinforcing protruding portion that is insulated from the semiconductor circuit and is formed of the same material as that of the substrate from which the reinforcing protruding portion is formed to protrude from the lamination surface with a height equal to the length of a gap between the lamination surfaces of wafers facing each other in an area where the protruding connection portion is not disposed on the lamination surface formed with the protruding connection portion; and
    forming the semiconductor circuit by laminating the plurality of wafers together and electrically connecting the electric signal connecting portions of each wafer.

11. The method of manufacturing the semiconductor device according to claim 10, wherein the forming of the protruding connection portion and the forming of the reinforcing protruding portion include:
    forming a conductive portion, which becomes the protruding connection portion, by forming a groove in one surface of the substrate having the protruding connection portion and embedding a conductive layer in the groove; and
    forming the protruding connection portion which protrudes from the lamination surface by exposing a part of the conductive portion by etching the substrate from the bottom surface selectively and simultaneously forming the reinforcing protruding portion which is a part of the substrate having the protruding connection portion and has a column-like shape.

* * * * *